US009553234B2

(12) United States Patent
Cha et al.

(10) Patent No.: US 9,553,234 B2
(45) Date of Patent: Jan. 24, 2017

(54) METHOD OF MANUFACTURING NANOSTRUCTURE SEMICONDUCTOR LIGHT EMITTING DEVICE

(71) Applicant: SAMSUNG ELECTRONICS CO., LTD., Suwon-si, Gyeonggi-do (KR)

(72) Inventors: Nam Goo Cha, Hwaseong-si (KR); Ki Hyung Lee, Yongin-si (KR); Wan Tae Lim, Suwon-si (KR); Geun Woo Ko, Suwon-si (KR); Min Wook Choi, Gimpo-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/607,920

(22) Filed: Jan. 28, 2015

(65) Prior Publication Data

US 2016/0013364 A1 Jan. 14, 2016

(30) Foreign Application Priority Data

Jul. 11, 2014 (KR) .................. 10-2014-0087228

(51) Int. Cl.
*H01L 21/00* (2006.01)
*H01L 33/24* (2010.01)
(Continued)

(52) U.S. Cl.
CPC ............ *H01L 33/24* (2013.01); *F21S 48/1109* (2013.01); *F21S 48/1159* (2013.01); *H01L 33/08* (2013.01);
(Continued)

(58) Field of Classification Search
None
See application file for complete search history.

(56) References Cited

U.S. PATENT DOCUMENTS

| 6,372,608 B1 | 4/2002 | Shimoda et al. |
| 6,645,830 B2 | 11/2003 | Shimoda et al. |

(Continued)

FOREIGN PATENT DOCUMENTS

| CN | 103426988 A | 12/2013 |
| JP | 2008-108757 A | 5/2008 |

(Continued)

*Primary Examiner* — Zandra Smith
*Assistant Examiner* — Andre' C Stevenson
(74) *Attorney, Agent, or Firm* — Lee & Morse, P.C.

(57) ABSTRACT

A method of manufacturing a nanostructure semiconductor light emitting device may includes preparing a mask layer by sequentially forming a first insulating layer and a second insulating layer on a base layer configured of a first conductivity-type semiconductor, forming a plurality of openings penetrating the mask layer, growing a plurality of nanorods in the plurality of openings, removing the second insulating layer, preparing a plurality of nanocores by regrowing the plurality of nanorods, and forming nanoscale light emitting structures by sequentially growing an active layer and a second conductivity-type semiconductor layer on surfaces of the plurality of nanocores. The plurality of openings may respectively include a mold region located in the second insulating layer, and the mold region includes at least one curved portion of which an inclination of a side surface varies according to proximity to the first insulating layer.

7 Claims, 22 Drawing Sheets

(51) Int. Cl.
  *H01L 33/08* (2010.01)
  *H01L 33/18* (2010.01)
  *F21S 8/10* (2006.01)
  *H01L 33/22* (2010.01)
  *F21Y 101/00* (2016.01)

(52) U.S. Cl.
  CPC ............... *H01L 33/18* (2013.01); *F21K 9/232* (2016.08); *F21Y 2101/00* (2013.01); *H01L 33/22* (2013.01); *H01L 2224/16245* (2013.01); *H01L 2224/32225* (2013.01); *H01L 2224/48091* (2013.01); *H01L 2224/48227* (2013.01); *H01L 2224/48464* (2013.01); *H01L 2224/73265* (2013.01); *H01L 2924/181* (2013.01)

(56) References Cited

U.S. PATENT DOCUMENTS

| | | | |
|---|---|---|---|
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,682,986 B2 | 3/2010 | Chi et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,846,846 B2 | 12/2010 | Bera et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,061 B2 | 11/2011 | Ehrenreich et al. | |
| 8,053,263 B2 | 11/2011 | Lee et al. | |
| 8,129,711 B2 | 3/2012 | Kang et al. | |
| 8,179,938 B2 | 5/2012 | Kim | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,735,931 B2 | 5/2014 | Han et al. | |
| 8,766,295 B2 | 7/2014 | Kim | |
| 2003/0168964 A1* | 9/2003 | Chen | H01L 33/20 313/495 |
| 2010/0283064 A1* | 11/2010 | Samuelson | B82Y 20/00 257/88 |
| 2012/0220135 A1 | 8/2012 | Nakagawa et al. | |
| 2013/0099199 A1 | 4/2013 | Cha et al. | |
| 2013/0115772 A1 | 5/2013 | Oishi et al. | |
| 2013/0140521 A1 | 6/2013 | Gilet et al. | |
| 2013/0313514 A1 | 11/2013 | Hwang et al. | |
| 2014/0124732 A1 | 5/2014 | Cha et al. | |
| 2014/0166974 A1 | 6/2014 | Yoo et al. | |
| 2014/0203240 A1 | 7/2014 | Hwang et al. | |
| 2014/0209858 A1 | 7/2014 | Cha et al. | |
| 2014/0209859 A1 | 7/2014 | Cha et al. | |
| 2014/0217357 A1 | 8/2014 | Yoo et al. | |
| 2014/0246647 A1 | 9/2014 | Cha et al. | |
| 2015/0102365 A1 | 4/2015 | Cha et al. | |
| 2015/0129834 A1 | 5/2015 | Cha et al. | |

FOREIGN PATENT DOCUMENTS

| | | | |
|---|---|---|---|
| JP | 2008-166567 A | 7/2008 | |
| JP | 2009-009977 A | 1/2009 | |
| JP | 2010-135859 A | 6/2010 | |
| KR | 10-0878539 B1 | 1/2009 | |
| KR | WO2014/119910 A1 * | 11/2010 | ............ H01L 33/18 |
| KR | 10-2012-0065607 A | 6/2012 | |
| KR | 10-2012-0067157 A | 6/2012 | |
| KR | 10-2013-0025856 A | 3/2013 | |
| KR | 10-1258583 B1 | 5/2013 | |
| KR | 10-2013-0131217 A | 12/2013 | |
| KR | 10-2013-0139113 A | 12/2013 | |
| KR | 10-1356701 B1 | 2/2014 | |
| KR | 10-2014-0077614 A | 6/2014 | |
| KR | 10-2014-0077616 A | 6/2014 | |
| KR | 10-2014-0096970 A | 8/2014 | |
| KR | 10-2014-0096979 A | 8/2014 | |
| KR | 10-2014-0096980 A | 8/2014 | |
| KR | 10-2014-0099803 A | 8/2014 | |
| KR | 10-2015-0043152 A | 4/2015 | |
| KR | 10-2015-0054383 A | 5/2015 | |
| WO | 2014/092517 A1 | 6/2014 | |
| WO | 2014/119910 A1 | 8/2014 | |
| WO | 2014/119911 A1 | 8/2014 | |

* cited by examiner

METHOD OF MANUFACTURING NANOSTRUCTURE SEMICONDUCTOR LIGHT EMITTING DEVICE

CROSS-REFERENCE TO RELATED APPLICATION

This application claims priority to Korean Patent Application No. 10-2014-0087228, filed on Jul. 11, 2014, with the Korean Intellectual Property Office, the entire contents of which are hereby incorporated herein by reference.

BACKGROUND OF THE INVENTION

Embodiments of the present inventive concept relate to a method of manufacturing a nanostructure semiconductor light emitting device.

Semiconductor light emitting devices such as light emitting diodes (LEDs) are devices capable of emitting light from materials included therein, through the conversion of energy generated by the recombination of electrons and holes into light. LEDs have many positive attributes such as a relatively long lifespan, low power consumption, rapid response speed, environmentally friendly characteristics, and the like, as compared to light sources according to the related art; therefore, LEDs have been widely used as light sources in various products such as lighting devices and display devices, and the development thereof has been accelerated.

Recently, as LEDs have come into widespread use, the range of uses thereof is being broadened to encompass the field of high current, high output light sources. As such, as LEDs are required in the field of high current, high output light sources, research into improving light emitting characteristics in the field of the present technology has continued. In particular, in order to increase light efficiency through improved crystallinity and increases in light emission regions, semiconductor light emitting devices having nanoscale light emitting structures have been proposed.

SUMMARY OF THE INVENTION

Some exemplary embodiments in the present inventive concept may provide novel methods of manufacturing a nanostructure semiconductor light emitting device, capable of efficiently and stably forming nanoscale light emitting structures.

According to an exemplary embodiment in the present inventive concept, a method of manufacturing a nanostructure semiconductor light emitting device may include preparing a mask layer by sequentially forming a first insulating layer and a second insulating layer on a base layer configured of a first conductivity-type semiconductor, forming a plurality of openings penetrating through the mask layer in a thickness direction of the mask layer, growing a plurality of nanorods configured of the first conductivity-type semiconductor in the plurality of openings, removing the second insulating layer to allow the plurality of nanorods to be exposed, preparing a plurality of nanocores by re-growing the plurality of nanorods, and forming nanoscale light emitting structures by sequentially growing an active layer and a second conductivity-type semiconductor layer on surfaces of the plurality of nanocores. The plurality of openings may respectively include a mold region located in the second insulating layer and defining a shape of side surfaces of the plurality of nanorods, and the mold region may include at least one curved portion of which an inclination of a side surface is changed according to proximity to the first insulating layer.

The mold region may include one first-type curved portion in which an inclination of a side surface is altered so that a width of the opening is first decreased and then increased according to proximity to the first insulating layer, and an inclination portion contacting the first insulating layer and having an inclined side surface so that a width of the opening is increased according to proximity to the first insulating layer.

The width of the opening at the first-type curved portion may be 70% or more of a width of an upper end portion of the opening.

An angle formed by the side surface of the inclination portion and an upper surface of the first insulating layer may be greater than 90 degrees and less than 100 degrees.

The mold region may include one second-type curved portion in which an inclination of a side surface is altered so that a width of the opening may be first increased and then decreased according to proximity to the first insulating layer, and an inclination portion contacting the first insulating layer and having an inclined side surface so that a width of the opening may be decreased according to proximity to the first insulating layer.

The width of the opening in a position of the second-type curved portion may be greater than that of an upper end portion of the opening, and a width of a lower end portion of the opening, contacting the first insulating layer, may be 70% or more of the width of the upper end portion of the opening.

An angle formed by the side surface of the inclination portion and an upper surface of the first insulating layer may be greater than 80 degrees and less than 90 degrees.

The mold region may include at least one first-type curved portion in which a width of the opening may be first decreased and then increased according to proximity to the first insulating layer, and at least one second-type curved portion in which a width of the opening is first increased and then decreased according to proximity to the first insulating layer.

The mold region may include an inclination portion which contacts the first insulating layer and in which a width of the opening is increased according to proximity to the first insulating layer.

The mold region may include an inclination portion which contacts the first insulating layer and in which a width of the opening is decreased according to proximity to the first insulating layer.

The plurality of openings may have an aspect ratio of 5:1 or more.

The second insulating layer may include a plurality of insulating layers having different etching rates in the same etching conditions.

The method of manufacturing a nanostructure semiconductor light emitting device may further include forming a current spreading layer on surfaces of the plurality of nanorods after the removing of the second insulating layer to allow the plurality of nanorods to be exposed.

The plurality of respective nanorods may include a body portion having a shape corresponding to that of the opening and an upper end portion disposed on the body portion. The method of manufacturing a nanostructure semiconductor light emitting device may further include forming a current blocking intermediate layer on the upper end portions of the plurality of nanorods after the growth of the plurality of nanorods.

According to an exemplary embodiment in the present inventive concept, a method of manufacturing a nanostructure semiconductor light emitting device may include preparing a mask layer having a plurality of openings to allow portions of a base layer to be exposed, the base layer being configured of a first conductivity-type semiconductor, growing a plurality of nanorods configured of the first conductivity-type semiconductor and including body portions having shapes corresponding to those of the openings and upper end portions disposed on the body portions, in the plurality of openings, removing a portion of the mask layer to allow the plurality of nanorods to be exposed, and preparing a plurality of nanocores by re-growing the plurality of nanorods, and forming nanoscale light emitting structures by sequentially growing an active layer and a second conductivity-type semiconductor layer on surfaces of the plurality of nanocores. The plurality of openings may respectively include a mold region contacting the body portion of the nanorod, and the mold region may include at least one curved portion by which an inclination of a side surface is changed.

BRIEF DESCRIPTION OF DRAWINGS

The above and other aspects, features and other advantages of the present inventive concept will be more clearly understood from the following detailed description taken in conjunction with the accompanying drawings, in which.

DETAILED DESCRIPTION

Figure 1:
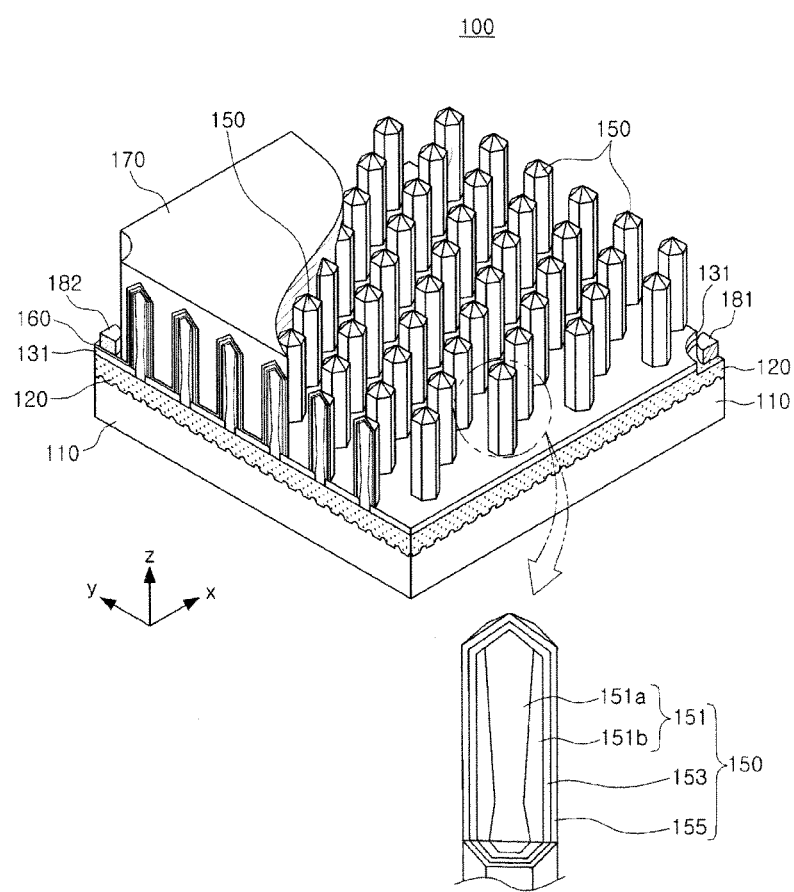
FIG. 1 is a schematic perspective view of a nanostructure semiconductor light emitting device according to an exemplary embodiment of the present inventive concept.

Embodiments of the present inventive concept will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art. Unless explicitly described otherwise, the terms 'upper part', 'upper surface', 'lower part', 'lower surface', 'side surface', and the like will be used, based on the drawings, and may be changed depending on a direction in which a semiconductor device is disposed.

In the drawings, the shapes and dimensions of elements may be exaggerated for clarity, and the same reference numerals will be used throughout to designate the same or like elements.

FIG. 1 is a schematic perspective view of a nanostructure semiconductor light emitting device according to an exemplary embodiment of the present inventive concept.

With reference to FIG. 1, a nanostructure semiconductor light emitting device 100 may include a substrate 110, a base layer 120 formed on the substrate 110, a first insulating layer 131, nanoscale light emitting structures 150, a transparent electrode layer 160, and a filling layer 170. The nanoscale light emitting structure 150 having a core-shell structure may include a nanocore 151 containing a nanorod 151a grown from the base layer 120 configured of a first conductivity-type semiconductor and a regrowth layer 151b formed on a surface of the nanorod 151a, an active layer 153, and a second conductivity-type semiconductor layer 155. The nanorod 151a may have a form in which a width thereof is first decreased and then increased toward a lower portion thereof, for example, according to proximity to the first insulating layer 131. Here, the lower portion refers to a portion of the nanorod which is adjacent to the base layer 120. The nanocore 151 may include a body portion having a hexagonal prism shape and an upper end portion having a hexagonal pyramid shape. The nanostructure semiconductor light emitting device 100 may further include a first electrode 181 and a second electrode 182 electrically connected to the base layer 120 and the second conductivity-type semiconductor layer 155, respectively.

In order to allow for a clearer understanding of the present inventive concept, in FIG. 1, a portion of constituent elements, for example, the transparent electrode layer 160 and a filling layer 170 are only shown in a portion of a region, and a cross section of a portion of constituent elements including the nanoscale light emitting structure 150 is illustrated on one end in an x direction thereof. Further, although a boundary between the nanorod 151a and the regrowth layer 151b is represented by a solid line to facilitate understanding of the present inventive concept, it may be difficult to discern a boundary therebetween.

FIGS. 2A through 2H are cross-sectional views illustrating various processes in a method of manufacturing a nanostructure semiconductor light emitting device according to an exemplary embodiment of the present inventive concept. With reference to FIGS. 2A through 2H, cross-sectional views taken across the first and second electrodes 181 and 182 are illustrated, while the number of nanoscale light emitting structures 150 selected optionally is only illustrated. Hereinafter, a method of manufacturing a nanostructure semiconductor light emitting structure according to an exemplary embodiment of the present inventive concept will be described in detail with reference to FIGS. 2A through 2H.

Figure 2A:
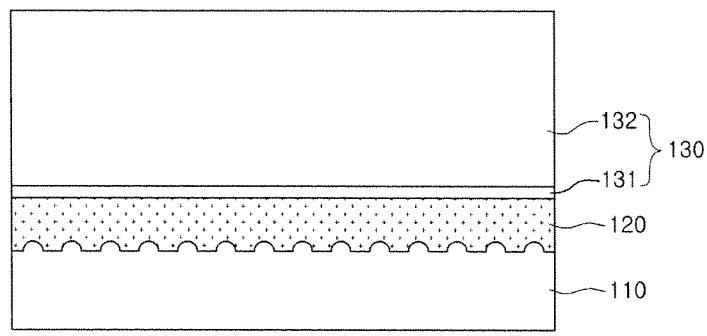
FIGS. 2A through 2H are cross-sectional views illustrating various processes in a method of manufacturing a nanostructure semiconductor light emitting device according to an exemplary embodiment of the present inventive concept.

Referring to FIG. 2A, a method of manufacturing a nanostructure semiconductor light emitting device according to an exemplary embodiment of the present inventive concept may be performed by first preparing a base layer 120 formed through a growth of a first conductivity-type semiconductor on a substrate 110.

The substrate 110 may be provided as a growth substrate and may be formed using an insulating substrate, a conductive substrate or a semiconductor substrate. For example, the substrate 110 may be formed using a material such as sapphire, silicon carbide (SiC), silicon (Si), $MgAl_2O_4$, MgO, $LiAlO_2$, $LiGaO_2$, GaN, or the like. In the case of a sapphire substrate, sapphire may be a crystal having Hexa-Rhombo R3c symmetry, and may have lattice constants of 13.001 Å and 4.758 Å in c-axis and a-axis directions, respectively, and may have a C plane (0001), an A plane (11-20), an R plane (1-102), and the like. In this case, since the C plane of sapphire crystal comparatively facilitates the growth of a nitride thin film and is stable at relatively high temperatures, the C plane sapphire substrate may be preferably used as a growth substrate for a nitride semiconductor.

The substrate 110 may include a concave-convex portion formed in an upper surface thereof so as to improve crystallinity of the base layer 120 to be grown thereon and light extraction efficiency. A shape of the concave-convex portion is not limited to that illustrated in the drawings, but may have various shapes such as a prism shape, a conical shape, a semispherical shape, and the like. The concave-convex portion may have a regular or irregular shape or pattern.

The base layer 120 configured of a first conductivity-type semiconductor may be commonly connected to one ends of a plurality of nanoscale light emitting structures to serve as a contact electrode, as well as providing crystal planes for growth of nanorods in a subsequent process. The first conductivity-type semiconductor forming the base layer 120 may be provided as a nitride semiconductor satisfying $Al_xIn_yGa_{1-x-y}N$ (0≤x<1, 0≤y<1, and 0≤x+y<1). For example, the first conductivity-type semiconductor forming the base layer 120 may be formed using a GaN single crystal doped with an n-type impurity such as Si or the like.

Although not illustrated in the drawings, a buffer layer for improving crystallinity of the base layer 120 configured of the first conductivity-type semiconductor may be further disposed between the substrate 110 and the base layer 120. The buffer layer may be configured of, for example, a layer of undoped $Al_xIn_yGa_{1-x-y}N$ (0≤x≤1, 0≤y≤1, and 0≤x+y≤1) grown at a relatively low temperature. On the other hand, the buffer layer may also be formed using a material such as $ZrB_2$, $HfB_2$, ZrN, HfN, TiN, or the like. In addition, the buffer layer may also be formed by combining a plurality of material layers or gradually changing a composition thereof.

Subsequently, a mask layer 130 may be formed by sequentially forming a first insulating layer 131 and a second insulating layer 132 on the base layer 120.

The first insulating layer 131 and the second insulating layer 132 may be formed using a material having electrical insulation properties. For example, the first insulating layer 131 and the second insulating layer 132 may be formed using an insulating material such as $Si_xN_y$, $SiO_x$, $SiO_xN_y$, $Al_2O_3$ or AlN, or the like. The first and second insulating layers 131 and 132 may be formed using materials having etch selectivity with respect to each other. For example, the first insulating layer 131 may be formed using $Si_xN_y$, and the second insulating layer may be formed using $SiO_x$.

According to an exemplary embodiment of the present inventive concept, the second insulating layer 132 may be configured to include a plurality of insulating layers having different etching rates under the same etching condition. Such a difference in etching rates may be implemented by a density difference between insulating layers. The plurality of insulating layers may be formed so that densities of respective insulating layers may be different from each other by controlling a respective insulating layer formation method and condition. According to an exemplary embodiment of the present inventive concept, an insulating layer having a highest etching rate under the same etching condition may be disposed as a lowest layer.

According to an exemplary embodiment of the present inventive concept, the first insulating layer 131 may include two or more material layers containing a graphene layer such that a leakage current may be reduced in the vicinity of the first insulating layer 131 even when a current is concentrated in lower regions of the nanoscale light emitting structures.

The first insulating layer 131 may have a thickness less than that of the second insulating layer 132. The first insulating layer 131 may have a thickness of 100 to 300 nm. A total of thickness of the mask layer 130 including the first and second insulating layers 131 and 132 may be designed in consideration of a height of nanoscale light emitting structures to be desired and may have a thickness of 1 to 10 μm.

Subsequently, with reference to FIG. 2B, openings H penetrating through the second insulating layer 132 in a thickness direction thereof may be formed.

Before performing an etching process of forming the openings H, an etching mask pattern 140 defining a position of the openings H having a predetermined array and shape on the second insulating layer 132 may be formed. The etching mask pattern 140 may be formed by using photoresist (PR), an amorphous carbon layer (ACL), a combination of an amorphous carbon layer and a photoresist layer, or the like. Here, since the amorphous carbon layer has higher etching resistance than that of the photoresist layer, an etch selectivity of the etching mask pattern 140 with respect to the second insulating layer 132 may be increased. When the etch selectivity of the etching mask pattern 140 is increased, an unwanted increase in a width $W_T$ of an upper end portion of the opening in a subsequent etching process of the second insulating layer 132 may be suppressed.

Subsequently, the openings H having a relatively high aspect ratio may be formed by anisotropically etching the second insulating layer 132 through the use of the etching mask pattern 140 as an etching mask. Such an anisotropic etching process may be performed using a plasma etching process, for example, using deep reactive ion etching (DRIE). The DRIE process may independently control the formation of high density plasma and energy of ions so as to provide a relatively rapid etching speed and facilitate the formation of an opening having a relatively high aspect ratio. According to an exemplary embodiment of the present inventive concept, an aspect ratio of the openings H penetrating through the second insulating layer 132 may be 5:1 or more, for example, 10:1 or more.

Figure 4A:
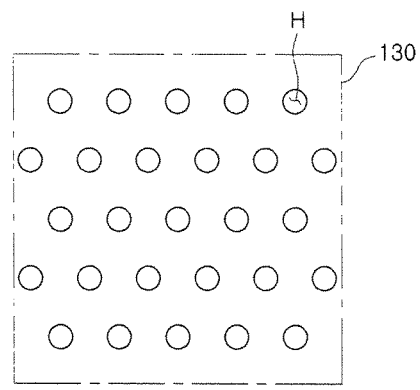
FIGS. 4A and 4B are plan views of mask layers illustrating cross-sectional shapes by way of examples, used in an exemplary embodiment of the present inventive concept.
Figure 4B:
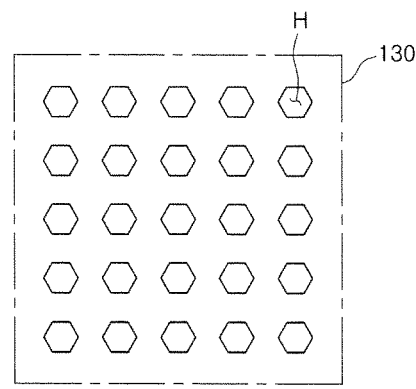

A cross sectional shape of the opening H penetrating through the second insulating layer 132 and an array thereof may be variously implemented. For example, the openings H may have various cross sectional shapes such as a circular shape, an elliptical shape, a polygonal shape, or the like. In detail, the cross sectional shapes and the array of the openings H may be a shape and an array represented in plan views of mask layers illustrated in FIGS. 4A and 4B. According to an exemplary embodiment of the present inventive concept, a width of the opening H and an interval between the openings H may be variously changed. A width of the opening H may be 500 nm or less, in detail, 200 nm or less.

The second insulating layer 132 according to the embodiment of the present inventive concept may be divided into a first region I adjacent to the first insulating layer 131 and a second region II formed on the first region I. Here, the first region I may be a region in which a body portion M of a nanorod 151a is located after a subsequent process of growing the nanorod is completed, and the second region II may be a region in which the upper end portions T of the nanorods 151a are located (see FIG. 2D).

In the present inventive concept, since a shape of the body portion M before regrowth thereof is defined by an opening region formed in the first region I, the opening region in the first region I may serve as a mold. Thus, the opening region formed in the first region I may be indicated as a 'mold region', and an opening region formed in the second region II may be indicated as a 'non-mold region'.

In the present inventive concept, a mold region of the respective opening H may include one first-type curved portion C1 in which an inclination of a side surface thereof is changed so that a width of the opening to be first decreased and then increased according to proximity to the first insulating layer 131. In addition, the mold region of the respective opening H may include an inclination portion disposed to be adjacent to the first insulating layer 131 and having an inclined side surface such that a width of the opening is increased according to proximity to the first insulating layer 131.

In order to improve structural stability of a nanorod to be grown in a subsequent process, a width of the opening in a position of the first-type curved portion C1 may be 70% or more of the width $W_T$ of an upper end portion of the opening. A width $W_B$ of a lower end portion of the opening is illustrated as being equal to the width $W_T$ of the upper end portion of the opening, but the present inventive concept is not limited thereto. On the other hand, in order to improve structural stability of the nanorod, the width $W_B$ of the lower end portion of the opening may be 70% or more of the width of the upper end portion of the opening and may not be greater than that of a predetermined nanocore, for example, 151 of FIG. 2F, provided after a regrowth process has been completed. In the embodiment of the present inventive concept, a width of the nanocore may be in a range of 300 nm to 500 nm.

An angle $\theta_B$ formed by a side surface of the inclination portion of the opening and an upper surface of the first insulating layer 131 may be greater than 90 degrees and less than 100 degrees.

Anisotropic etching of the second insulating layer 132 for the formation of the openings H may be performed using mixture gas in which fluorocarbon-based gas, Ar gas and $O_2$ gas are mixed at an appropriate ratio. For example, the fluorocarbon-based gas may contain at least one of a group consisting of $CF_4$, $C_2F_6$, $C_3F_8$, $C_4F_8$, $C_4F_6$, $C_5F_8$, and the like. According to an etching condition, hydrofluorocarbon-based gas may be further mixed or may be mixed to replace the fluorocarbon-based gas. For example, the hydrofluorocarbon-based gas may contain at least one of a group consisting of $CHF_3$, $CH_2F_2$, and the like.

Formation of the openings H according to the embodiment of the present inventive concept may be performed through, for example, a method in which under a specific etching condition of process pressure of 20 mTorr and mixture gas of $C_4F_8$ of 6 sccm, $O_2$ of 5 sccm and Ar of 55 sccm, after a process (a main etching process) of performing etching to be undertaken to a lower portion of the second insulating layer so as to allow a portion of the first insulating layer 131 that is an etching stop layer to be exposed, an additional etching process (an over-etching process) of changing an etching condition such as a gas flow ratio, process pressure and the like is performed. Here, the second insulating layer may be configured of two insulating layers having different etching rates under the same etching condition, and an insulating layer having a relatively high etching rate may be disposed to be adjacent to the first insulating layer. On the other hand, a wet etching process may be further performed after a dry etching process using plasma is completed.

Figure 2B:
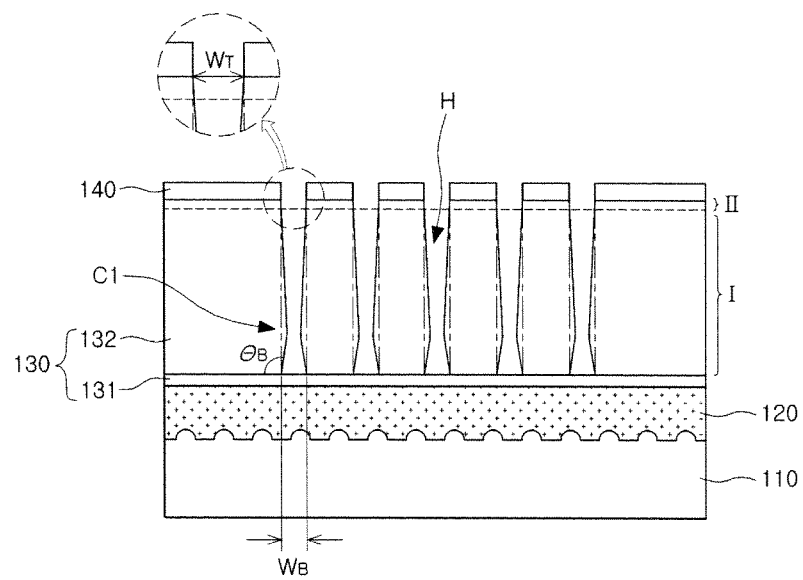
Figure 3A:
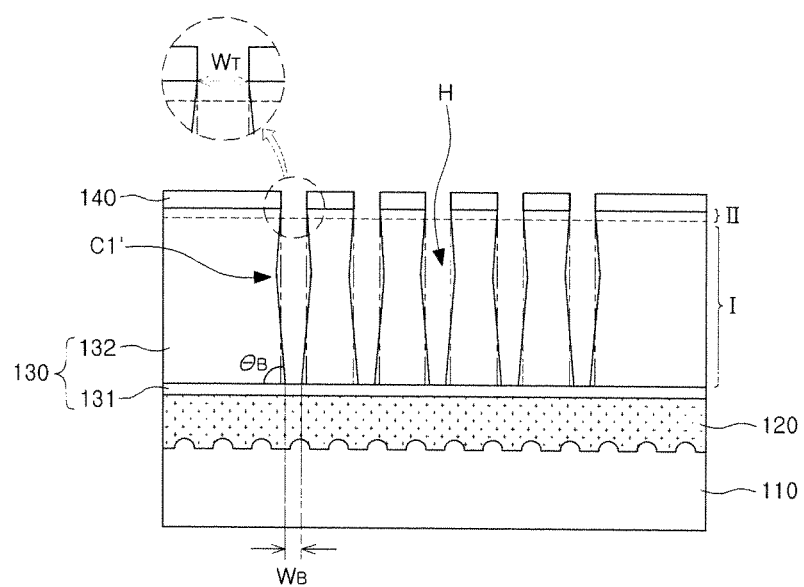
FIGS. 3A through 3C are schematic cross-sectional views of mask layers illustrating etching profiles of openings used in an exemplary embodiment of the present inventive concept.
Figure 3B:
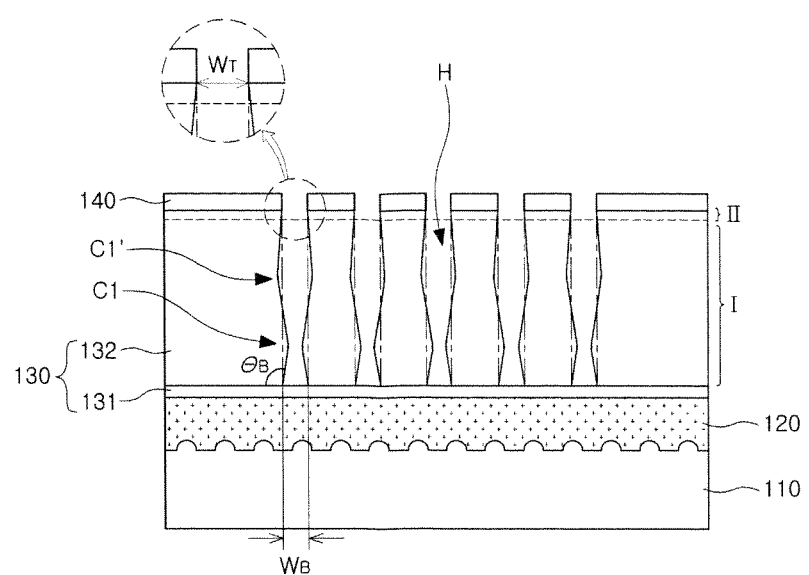
Figure 3C:
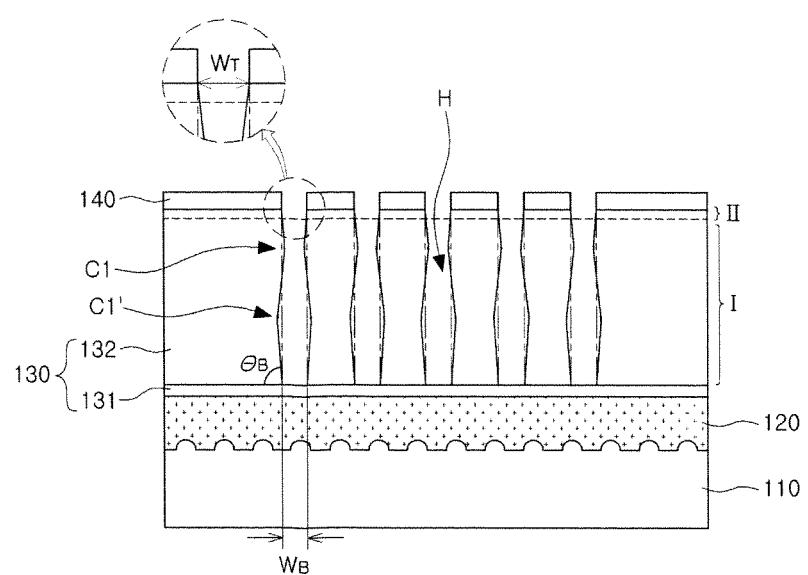

The openings H of FIG. 2B are illustrated in profile, where one first-type curved portion in which an inclination of a side surface thereof is altered so that a width of the opening is first reduced and then increased according to proximity to the first insulating layer 131 is included in a mold region, but according to an exemplary embodiment of the present inventive concept, the openings may alternatively have profiles illustrated in FIGS. 3A and 3C.

As illustrated in FIG. 3A, the mold region of the respective opening H may have one second-type curved portion C1' in which an inclination of a side surface thereof is altered so that a width of the opening is first increased and then reduced according to proximity to the first insulating layer 131. The second-type curved portion may be a so-called bow. In addition, the mold region of the respective opening H may include an inclination portion formed to be adjacent to the first insulating layer 131 and having an inclined side surface such that a width of the opening is reduced according to proximity to the first insulating layer 131.

A width of the opening in a position of the second-type curved portion C1' may be greater than the width $W_T$ of the upper end portion of the opening and may not be greater than that of a predetermined nanocore, for example, 151 of FIG. 2F, provided after a regrowth process has been completed. In order to improve structural stability of a nanorod to be grown in a subsequent process, a width $W_B$; of a lower end portion of the opening may be 70% or more of the width $W_T$ of the upper end portion of the opening. An angle $\theta_B$ formed by a side surface of the inclination portion of the opening and an upper surface of the first insulating layer 131 may be greater than 80 degrees and less than 90 degrees.

As illustrated in FIGS. 3B and 3C, the mold region of the respective opening H may include the one first-type curved portion C1 in which an inclination of a side surface thereof is changed so that a width of the opening is first decreased and then increased according to proximity to the first insulating layer 131, and the one second-type curved portion C1' in which a size of the opening is first increased and then decreased according to proximity to the first insulating layer 131. The mold region of the opening H illustrated in FIG. 3B may be provided so that the first-type curved portion C1 is disposed below the second-type curved portion C1', and may include an inclination portion which is disposed to be adjacent to the first insulating layer 131 and in which an inclination of a side surface thereof is changed so that a width of the opening is increased according to proximity to the first insulating layer 131. The mold region of the opening H illustrated in FIG. 3C may be provided so that the second-type curved portion C1' is disposed below the first-type curved portion C1, and may include an inclination portion which is disposed to be adjacent to the first insulating layer 131 and in which a size of the opening is decreased according to proximity to the first insulating layer 131.

A profile of the mold region of the opening H is not limited to the illustration of the drawings and may have various shapes using an etching process suitable therefor. For example, a profile of the mold region of the opening H may be formed to include a plurality of first-type curved portions and a plurality of second-type curved portions.

Figure 2C:
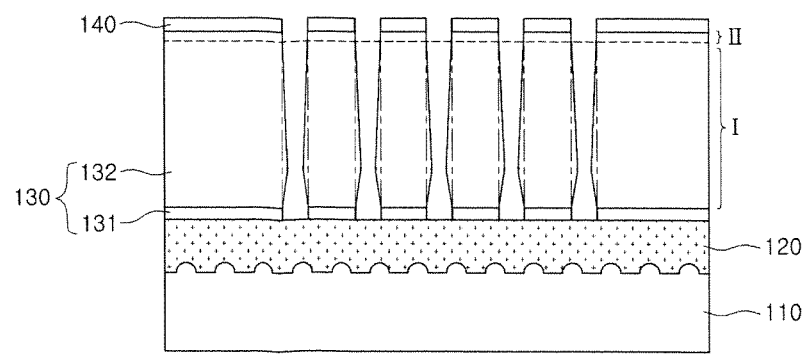

Subsequently, as illustrated in FIG. 2C, the openings H may be extended to allow portions of the base layer 120 to be exposed by anisotropically etching the first insulating layer 131 through a plasma etching process. The exposed portions of the base layer 120 through the openings H may be used as a seed for the growth of nanorods in a subsequent process.

Figure 2D:
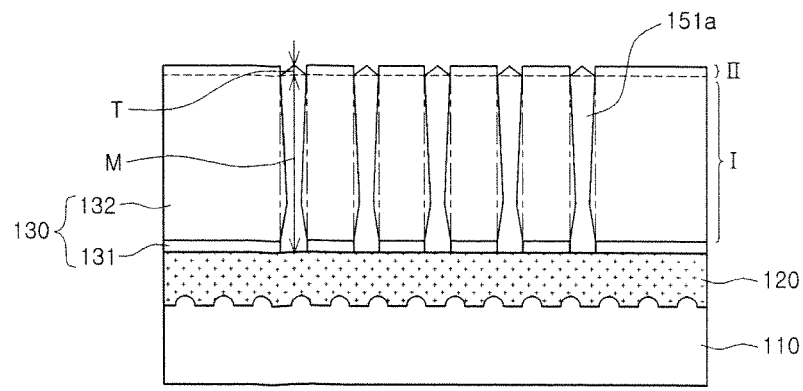

Subsequently, as illustrated in FIG. 2D, a plurality of nanorods 151a configured of the first conductivity-type semiconductor may be grown by performing a selective epitaxial growth (SEG) process in the exposed portions of the base layer 120 so as to fill the plurality of openings H therewith. Since the openings H of the mask layer 130 may serve as the mold in growing the nanorods 151a, the nanorods 151a may have a shape corresponding to that of the openings H. Therefore, in the embodiment of the present inventive concept, the nanorods 151a may have a form including one curved portion in which an inclination of a side surface thereof is altered so that a width of the nanorod 151a is first reduced and then increased according to proximity to the first insulating layer 131, and an inclination portion formed to be adjacent to the first insulating layer 131 and including an inclined side surface so that a width of the nanorod 151a is increased according to proximity to the first insulating layer 131, so as to correspond to the shape of the openings H illustrated in FIG. 2B. In addition, for example, when the plurality of openings H have a circular cross-sectional shape, a body portion M of the nanorod 151a may have a cylindrical shape and the upper end portion T of the nanorod 151a may have a hexagonal pyramid shape in a state in which the formation of a portion of edges thereof is not completed or a conical shape. On the other hand, the upper end portions T of the nanorods 151a may be located in the second region II of the second insulating layer 132 and the body portions M of the nanorods 151a may be located in the first region I of the second insulating layer 132.

The first conductivity-type semiconductor forming the nanorods 151a may be a nitride semiconductor satisfying $Al_xIn_yGa_{1-x-y}N$ ($0 \leq x \leq 1$, $0 \leq y \leq 1$, and $0 \leq x+y \leq 1$), similar to the case of the base layer 12. For example, the first conductivity-type semiconductor forming the nanorod 151a may be formed using a GaN single crystal doped with an n-type impurity such as Si or the like.

The first conductivity-type semiconductor forming the nanorod 151a may be formed using a metal-organic vapor phase epitaxy (MOVPE) process, a hydride vapor phase epitaxy (HVPE) process, a molecular beam epitaxy (MBE) process, or the like.

Figure 2E:
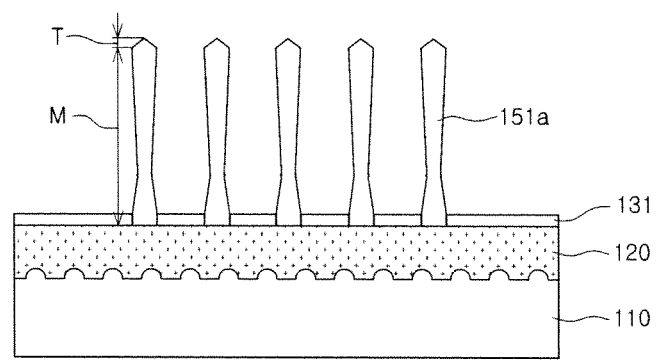
Figure 2F:
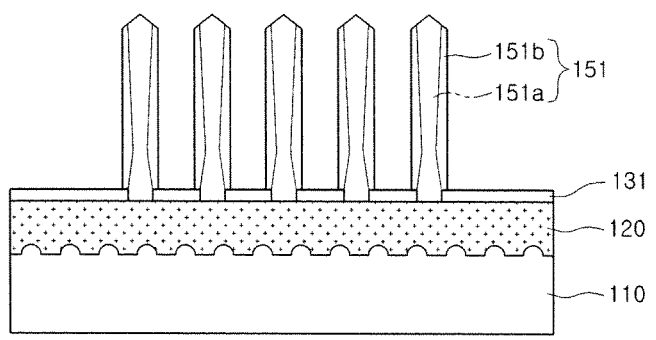

Next, as illustrated in FIG. 2E, the second insulating layer 132 may be completely removed such that side surfaces of the plurality of nanorods 151a are exposed thereby.

In the embodiment of the present inventive concept, only the first insulating layer 131 may remain by applying an etching process thereto under a condition in which the second insulating layer 132 may be selectively removed. Such a removal process may be performed using a wet etching process. For example, when the second insulating layer 132 is formed using a silicon oxide and the first insulating layer 131 is formed using a silicon nitride, a wet etching process using a buffered oxide etchant (BOE) or a HF solution may be performed. On the other hand, the remaining first insulating layer 131 may serve to prevent the active layer 153 and the second conductivity-type semiconductor layer 155 formed in a subsequent process from being connected to the base layer 120.

Then, as illustrated in FIG. 2F, after the second insulating layer 132 is removed, a process of regrowing the nanorods 151a may be performed to improve crystallinity of the nanorods 151a and form stable crystal surfaces thereof.

The nanorod 151a may have a shape determined depending on a shape of the opening. Although the shape of the nanorod 151a may be changed according to a shape of the opening H, a surface of the nanorod 151a obtained through the method as in the embodiment of the present inventive concept may have thermodynamically unstable surfaces, and such unstable surfaces may not be appropriate for subsequent crystal growth.

As in the present embodiment of the present inventive concept, under a predetermined process condition, a regrowth process may be performed to form a regrowth layer 151b on surfaces of the nanorods 151a having an unstable surface and a non-uniform width, such that the nanocores 151 having a thermodynamically stable surface appropriate for crystal growth and a uniform width may be provided. For example, when the first conductivity-type semiconductor forming the nanocore 151 is formed using n-type gallium nitride (GaN), the body portion M of the nanocore 151 may have a hexagonal prism shape configured of an m plane as a non-polar plane, and the upper end portion T of the nanocore 151 may have a hexagonal pyramid shape configured of an r plane as a semi-polar plane.

The formation of the regrowth layer 151b may be performed, for example, in a hydrogen ($H_2$) atmosphere, and a precursor of a material forming a semiconductor and source gas of impurities may be supplied to a process chamber. For example, when the first conductivity-type semiconductor is an n-type GaN semiconductor, trimethylgallium (TMGa) which is relatively easily decomposed in a hydrogen ($H_2$) atmosphere may be supplied as a gallium precursor, and ammonia ($NH_3$) may be used as a nitrogen precursor. In order to perform an impurity implantation, silane ($SiH_4$) gas may be used as source gas. When the regrowth process is performed in the hydrogen ($H_2$) atmosphere, the r plane of the upper end portion T may be passivated by hydrogen (H$_2$), and thus, lateral growth from the body portion M may be induced, relative to growth from the upper end portion T. According to exemplary embodiments of the present inventive concept, the regrowth process may be performed in a nitrogen (N$_2$) atmosphere or an atmosphere provided by mixing hydrogen (H$_2$) and nitrogen (N$_2$).

A process temperature may be appropriately determined within a temperature range of 950° C. to 1150° C. In addition, process pressure may be selected in a range of 80 mbar to 220 mbar. Further, a concentration of an impurity injected at the time of formation of the regrowth layer 151*b* may be different from that of an impurity injected at the time of the growth of the nanorod 151*a*.

On the other hand, according to exemplary embodiments of the present inventive concept, a regrowth process may be performed through a plurality of operations under different process conditions of temperature, pressure, ambient gas, and the like.

In order to allow for a clearer understanding of FIG. 2F, a boundary between the nanorod 151*a* and the regrowth layer 151*b* is illustrated by a solid line, but actually, a boundary between two constituent elements may not be discerned.

Figure 2G:
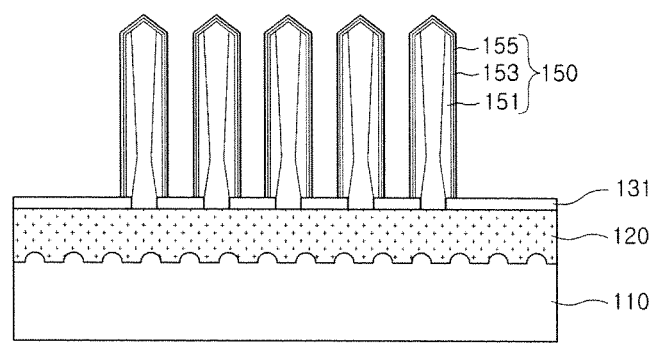

Next, as illustrated in FIG. 2G, the active layer 153 and the second conductivity-type semiconductor layer 155 may be sequentially formed on surfaces of the plurality of nanocores 151.

In this stage, the nanoscale light emitting nanostructures 150 having a core-shell structure may be formed. According to a deposition condition, the active layer 153 and the second conductivity semiconductor layer 155 may have a different thickness on the m plane forming the body portion of the nanocore 151 and the r plane forming the upper end portion thereof. For example, the active layer 153 and the second conductivity-type semiconductor layer 155 may be thicker on the body portion than on the upper end portion.

The active layer 153 may have a multiple quantum well (MQW) structure in which quantum well layers and quantum barrier layers are alternately stacked on top of each other, and for example, may have a gallium nitride (GaN)/indium gallium nitride (InGaN) structure or an aluminum gallium nitride (AlGaN)/gallium nitride (GaN) structure in the case of a nitride semiconductor. According to an exemplary embodiment of the present inventive concept, the active layer 153 may also have a single quantum well (SQW) structure.

The second conductivity-type semiconductor layer 155 may be a nitride semiconductor layer satisfying Al$_x$In$_y$Ga$_{1-x-y}$N ($0 \leq x < 1$, $0 \leq y < 1$, and $0 \leq x+y < 1$) and doped with a p-type impurity. The second conductivity-type semiconductor layer 155 may further include an electron blocking layer (not shown) located to be adjacent to the active layer 153. The electron blocking layer may have a structure in which a plurality of different compositional Al$_x$In$_y$Ga$_{1-x-y}$N ($0 \leq x < 1$, $0 \leq y < 1$, and $0 \leq x+y < 1$) layers are stacked or may include one or more layers configured of Al$_y$Ga$_{1-y}$N ($0 \leq y < 1$). The electron blocking layer may have a bandgap greater than that of the active layer 153 to thus prevent electrons injected from the nanocore 151 configured of the first conductivity-type semiconductor from flowing to the second conductivity-type semiconductor layer 155 without electron-hole recombination in the active layer 153.

Figure 2H:
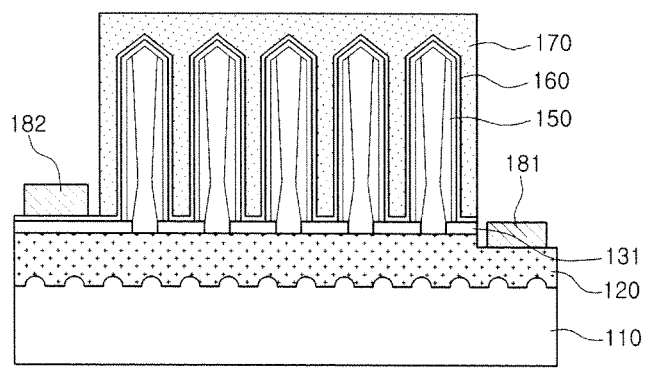

Then, as illustrated in FIG. 2H, a contact electrode layer 160 and a filling layer 170 may be formed on the nanoscale light emitting structures 150.

The contact electrode layer 160 may be formed as a single layer on the plurality of nanoscale light emitting structures 150 so as to cover an upper surface of the first insulating layer 131 between nanoscale light emitting structures 150.

The contact electrode layer 160 may be formed using a material appropriate for forming ohmic contact with the second conductivity-type semiconductor layer of the nanoscale light emitting structure 150. For example, the contact electrode layer 160 may contain at least one of, for example, silver (Ag), nickel (Ni), aluminum (Al), rhodium (Rh), palladium (Pd), iridium (Ir), ruthenium (Ru), magnesium (Mg), zinc (Zn), platinum (Pt), gold (Au), and may have a structure of a single layer or a plurality of layers. In addition, the contact electrode layer may be formed using transparent conductive oxide (TCO). For example, the contact electrode layer 160 may be formed using at least one of a group including indium tin oxide (ITO), zinc-doped indium tin oxide (ZITO), zinc indium oxide (ZIO), gallium indium oxide (GI), zinc tin oxide (ZTO), fluorine-doped tin oxide (FTO), aluminium-doped zinc oxide (AZO), gallium-doped zinc oxide (GZO), In$_4$Sn$_3$O$_{12}$ and Zn$_{(1-x)}$Mg$_x$O (Zinc Magnesium Oxide, $0 \leq x \leq 1$). The contact electrode layer 160 may also contain graphene as needed. The contact electrode layer 160 may be formed through a deposition process such as chemical vapor deposition (CVD) or physical vapor deposition (PVD).

The filling layer 170 may be formed using oxide or nitride. As necessary, the filling layer 170 may be formed using a material such as tetraethyl orthosilicate (TEOS), borophospho silicate glass (BPSG), spin-on-glass (SOG), spin-on-dielectric (SOD) and the like. In addition, the filling layer 170 may be formed using a thermosetting polymer such as an epoxy resin, a silicone resin, and the like.

Figure 7A:
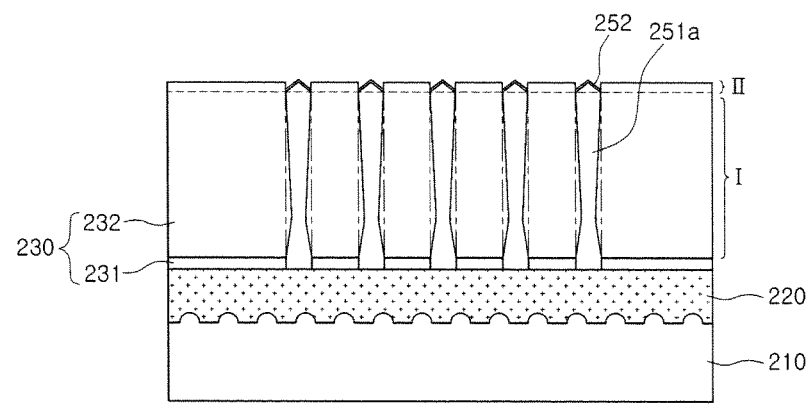
FIGS. 7A through 7D are cross-sectional views illustrating various processes of a method of manufacturing a nanostructure semiconductor light emitting device according to an exemplary embodiment of the present inventive concept.
Figure 7B:
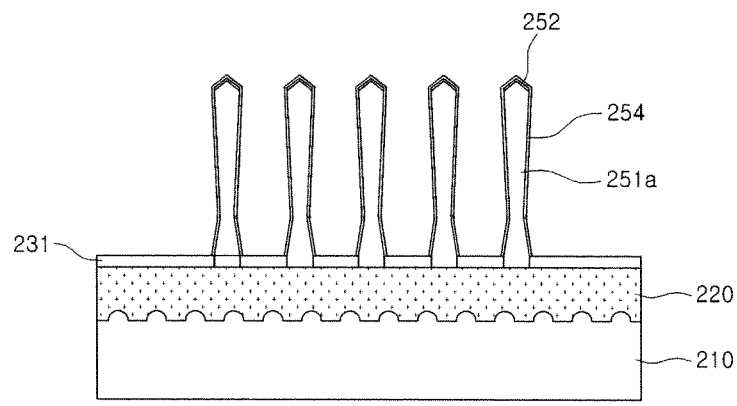
Figure 7C:
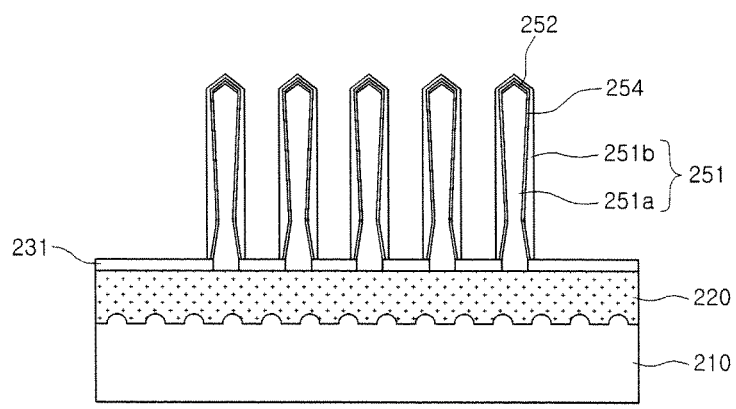
Figure 7D:
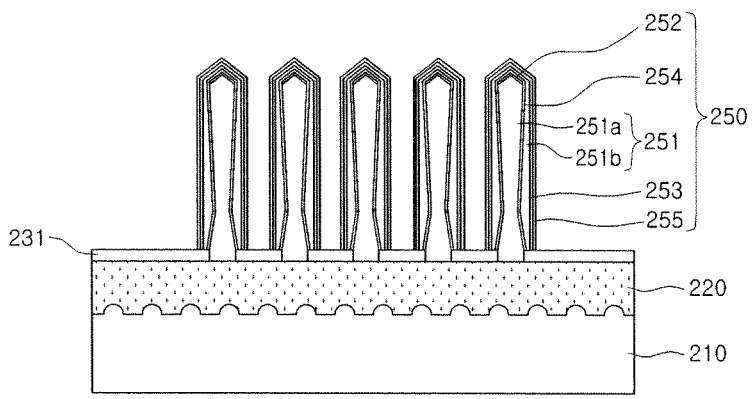
Figure 8A:
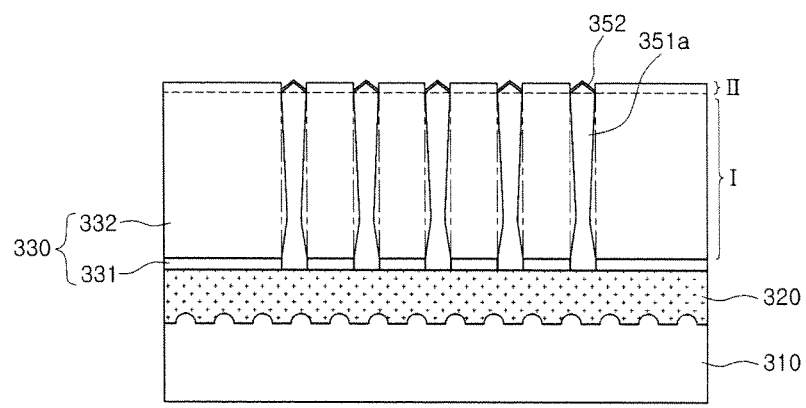
FIGS. 8A through 8D are cross-sectional views illustrating various processes in a method of manufacturing a nanostructure semiconductor light emitting device according to an exemplary embodiment of the present inventive concept.
Figure 8B:
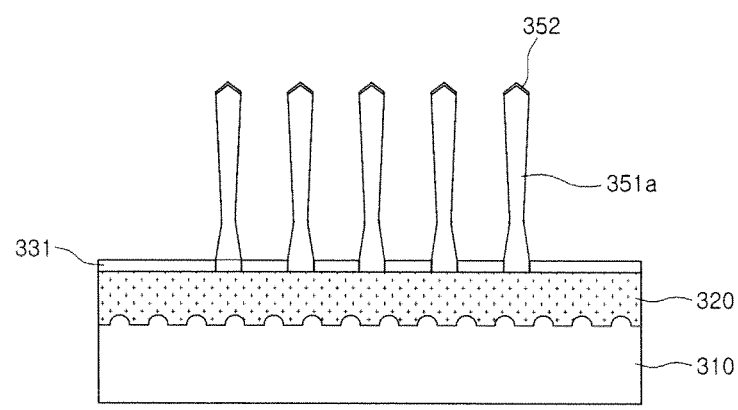
Figure 8C:
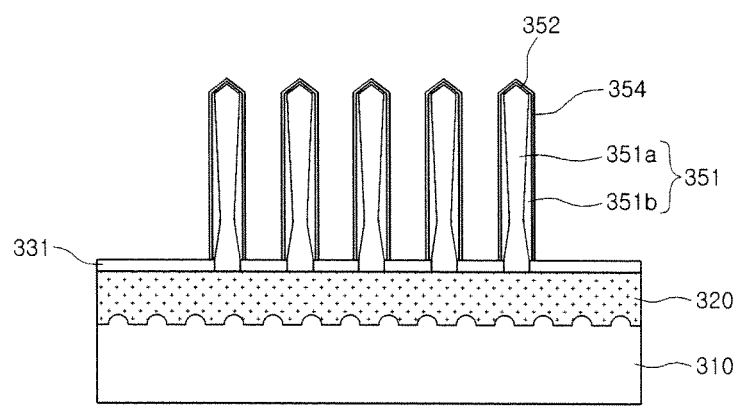
Figure 8D:
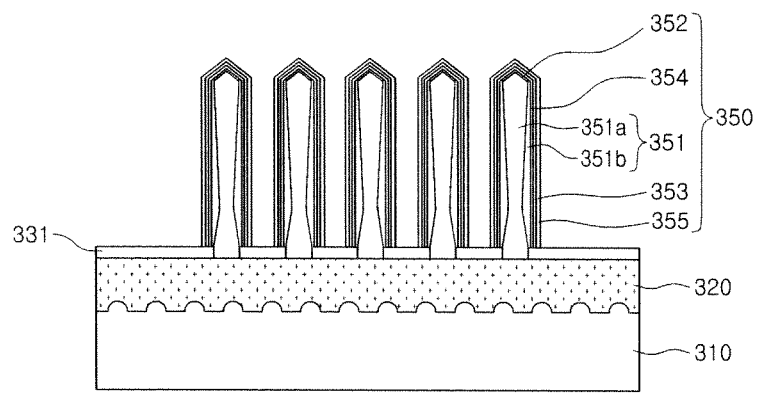

On the other hand, in the case of the nanoscale light emitting structure according to the embodiment of the present inventive concept, the nanoscale light emitting structure 150 as illustrated in FIG. 2G is employed, but according to an exemplary embodiment of the present inventive concept, nanoscale light emitting structures 250 and 350 respectively illustrated in FIG. 7D or 8D may be employed.

Subsequently, a portion of the base layer 120 and a portion of the contact electrode layer 160 may be exposed through a photolithography and plasma etching process. The first electrode 181 and the second electrode 182 may be disposed on the exposed portions of the base layer 120 and the contact electrode layer 160, respectively.

As a material of the first electrode 181 and the second electrode 182, a material such as gold (Au), silver (Ag), aluminum (Al), titanium (Ti), tungsten (W), copper (Cu), tin (Sn), nickel (Ni), platinum (Pt), chromium (Cr), aluminium-doped zinc oxide (AZO), gallium-doped zinc oxide (GZO), indium tin oxide (ITO), graphene, TiW, AuSn, or the like may be used.

Figure 5A:
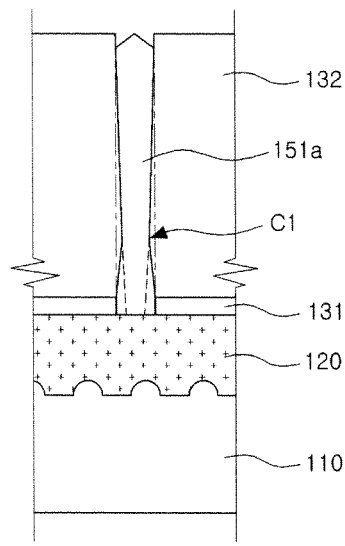
FIGS. 5A and 5B are cross-sectional views illustrating an amount of regrowth of a nanorod according to an exemplary embodiment of the present inventive concept.
Figure 5B:
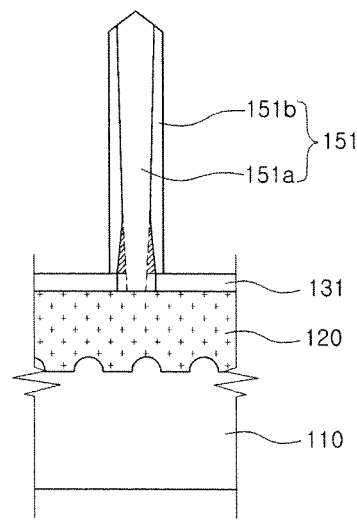

FIGS. 5A and 5B are cross-sectional views illustrating an amount of regrowth of a nanorod according to an exemplary embodiment of the present inventive concept.

FIG. 5A illustrates a nanorod 151*a* grown to correspond to the opening having an etching profile in which the first-type curved portion C1 is included in a lower region thereof and a width of a lower end portion of the opening is the same as that of an upper end portion thereof, as described above with reference to FIG. 2D. In the case of a nanorod (represented by a dotted line) grown to correspond to the opening in which a width of the opening is gradually reduced while having a predetermined inclination on a side surface thereof and the profile of which frequently occurs in an anisotropic etching process of openings having a relatively high aspect ratio, since a width of a lower portion of the nanorod is relatively narrow, the nanorod may be easily broken in a subsequent process, while in the case of the nanorod 151a according to the embodiment of the present inventive concept, as a width of a lower portion thereof is increased, structural stability of the nanorod 151a in a subsequent process may be improved. For example, in a wet etching and cleaning process in which the second insulating layer 132 is removed after the nanorod 151a is grown, the nanorod 151a may be prevented from being broken during a cleaning process. In addition, as compared to a nanorod (represented by a dotted line) grown to correspond to the opening in which a width of the opening is gradually reduced while having a predetermined inclination on a side surface thereof, an amount of regrowth of the nanorod 151a according to the embodiment of the present inventive concept may be reduced in a subsequent process of re-growing the nanorods 151a to prepare the nanocores 151. For example, the amount of regrowth may be reduced to correspond to an amount corresponding to an oblique portion of FIG. 5B. Although the reduction in the regrowth amount is two-dimensionally illustrated in FIG. 5B, the reduction in the regrowth amount of the present inventive concept may be understood based on a three-dimensional shape. Such a reduction in the regrowth amount may also be understood as being the reduction in a regrowth time in the same process conditions.

Figure 6A:
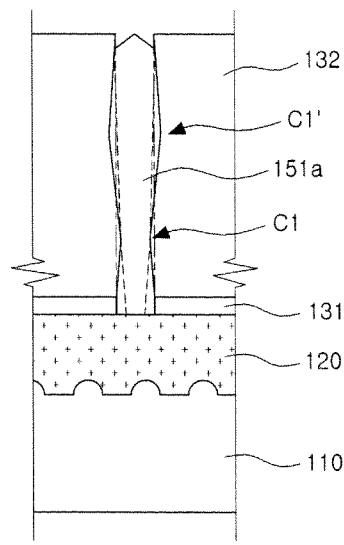
FIGS. 6A and 6B are cross-sectional views illustrating an amount of regrowth of a nanorod according to an exemplary embodiment of the present inventive concept.
Figure 6B:
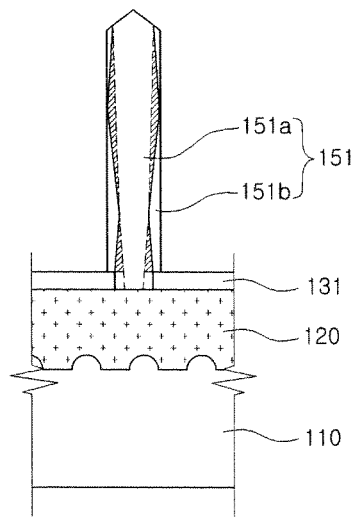

FIGS. 6A and 6B are cross-sectional views illustrating an amount of regrowth of a nanorod according to an exemplary embodiment of the present inventive concept.

FIG. 6A illustrates a nanorod 151a grown to correspond to a shape of an opening having an etching profile in which one second-type curved portion C1' is formed in an upper portion thereof, one first-type curved portion C1 is formed in a lower portion thereof, and an inclination portion is formed to be adjacent to the first insulating layer 131 and formed so that a size of the opening may be increased according to proximity to the first insulating layer 131, as described above with reference to FIG. 3B. In this case, as compared to a nanorod (represented by a dotted line) grown to correspond to a shape of the opening in which a width of the opening is gradually reduced while having a predetermined inclination on a side surface thereof, a width of a lower portion of the nanorod 151a according to an exemplary embodiment of the present inventive concept may be increased such that structural stability of the nanorods 151a in a subsequent process may be improved and an amount of regrowth of the nanorods 151a may be reduced in a subsequent process of re-growing the nanorods 151a to prepare the nanocores 151. An amount of regrowth of the nanorods 151a according to the embodiment of the present inventive concept may be reduced to correspond to an amount corresponding to an oblique portion of FIG. 6B.

FIGS. 7A through 7D are cross-sectional views illustrating various processes in a method of manufacturing a nanostructure semiconductor light emitting device according to an exemplary embodiment of the present inventive concept.

With reference to FIGS. 7A through 7D, a process of forming a nanoscale light emitting structure, further including a current blocking intermediate layer 252 and a current spreading layer 254, will be described below.

The processes of forming the nanoscale light emitting structure according to the embodiment of the present inventive concept may be processes subsequently performed, based on a state in which the processes described above with reference to FIGS. 2A through 2D are completed.

As illustrated in FIG. 7A, after a process of growing a plurality of nanorods 251a, as described above with reference to FIG. 2D, is completed, the current blocking intermediate layers 252 may be selectively formed on upper end portions of the nanorods 251a.

The current blocking intermediate layer 252 may be formed using a material having a relatively high degree of electrical resistance so as to prevent a leakage current occurring by an upper end portion of the nanorod 251a configured of the first conductivity-type semiconductor. The current blocking intermediate layer 252 may be configured of a semiconductor that is not intentionally doped with or is doped with a second conductivity-type impurity opposite to the first conductivity-type impurity. For example, when the nanorod 251a configured of the first conductivity-type semiconductor is formed using n-type gallium nitride (n-GaN), the current blocking intermediate layer 54 may be formed using an undoped GaN layer or a p-type gallium nitride (p-GaN) layer.

The current blocking intermediate layer 54 may have a thickness of about 50 nm or more so as to have a sufficient degree of electrical resistance. For example, when the doping process is performed using the second conductivity-type impurity, a concentration of the second conductivity-type impurity of the current blocking intermediate layer 252 may be about $1.0 \times 10^{16}/Cm^3$ or more. In the case of the current blocking intermediate layer 252 doped with the second conductivity-type impurity, a thickness and a concentration thereof may be complementarily adjusted. For example, in a case in which the thickness thereof is relatively thin, a doping concentration may be increased to secure resistance properties, and in the reverse case, the same manner may be applied thereto.

As such, by forming the current blocking intermediate layer 252 on an upper end portion of the nanorod 251a, a leakage current of the nanostructure semiconductor light emitting device may be reduced while improving light emission efficiency, and a portion of the active layer located on an upper end portion of the nanorod does not contribute to light emission, thereby precisely designing a light emitting wavelength.

Then, as illustrated in FIG. 7B, the nanorods 251a may be exposed by removing the second insulating layer 232. Subsequently, the current spreading layer 254 may be formed on surfaces of the nanorods 251a of which the upper end portions are provided with the current blocking intermediate layer 252 formed thereon.

The current spreading layer 254 may have a multilayer structure in which two or more semiconductor layers having different energy bands are stacked or may have a multilayer structure in which two or more semiconductor layers doped with different-types of conductivity-type impurity are stacked and a multilayer structure in which two or more semiconductor layers doped with the same-type conductivity-type impurity at different concentrations are stacked. The current spreading layer 254 may have a superlattice structure. For example, when the nanorod 251a configured of the first conductivity-type semiconductor is configured of an n-type gallium nitride (n-GaN) nitride semiconductor, the current spreading layer 254 may be formed using a composition represented by $In_xAl_yGa_{1-x-y}N$ ($0 \leq x < 1$, $0 \leq y < 1$, and $0 \leq x+y < 1$). In further detail, a nitride semiconductor layer having different energy bands forming the current spreading layer 254 may be formed to have different composition ratios of Al and In in the composition $In_xAl_yGa_{1-x-y}N$ ($0 \leq x < 1$, $0 \leq y < 1$, and $0 \leq x+y < 1$). A nitride semiconductor layer doped with different-types of conductivity-type impurity may be formed using a composition represented by In$_x$Al$_y$Ga$_{1-x-y}$N (0≤x<1, 0≤y<1, and 0≤x+y<1) while applying different doping concentrations of an n-type impurity and a p-type impurity thereto.

As an aspect ratio of the nanorod is increased, for example, an aspect ratio of the nanoscale light emitting structure is increased, a phenomenon in which a current is concentrated in a lower region of the nanoscale light emitting structure may occur to deteriorate light emission efficiency of the nanostructure semiconductor light emitting device.

As in the embodiment of the present inventive concept, by forming the current spreading layer on the nanorod surface so as to allow the current to be spread in a height direction of the nanorod, the deterioration in the light emission efficiency due to such a current concentration phenomenon may be prevented.

Subsequently, as illustrated in FIG. 7C, in order to improve crystallinity of the nanorods 251$a$ and have thermodynamically stable crystal surfaces appropriate for crystal growth, a process of re-growing the nanorods 251$a$ may be performed. Since the same process as that described with reference to FIG. 2F may be used, repeated descriptions will be omitted.

Then, as illustrated in FIG. 7D, an active layer 253 and a second conductivity-type semiconductor layer 255 may be sequentially formed on surfaces of the plurality of nanocores 251. Since the same process as that described with reference to FIG. 2G may be used, repeated descriptions will be omitted.

FIGS. 8A through 8D are cross-sectional views illustrating various processes in a method of manufacturing a nanoscale light emitting structure according to an exemplary embodiment of the present inventive concept.

With reference to FIGS. 8A through 8D, a process of forming a nanoscale light emitting structure, further including a current blocking intermediate layer 352 and a current spreading layer 354, will be described below.

The processes of forming the nanoscale light emitting structure according to the embodiment of the present inventive concept may be processes subsequently performed, based on a state in which the processes described above with reference to FIGS. 2A through 2D are completed.

As illustrated in FIG. 8A, after a process of growing a plurality of nanorods 351$a$, as described above with reference to FIG. 2D, is completed, the current blocking intermediate layers 352 may be selectively formed on upper end portions of the nanorods 351$a$.

Since the same process as that described with reference to FIG. 7A may be used, repeated descriptions will be omitted.

Subsequently, as illustrated in FIG. 8B, only a first insulating layer 331 may remain and a second insulating layer 332 may be removed to allow the nanorods 351$a$ to be exposed.

Subsequently, as illustrated in FIG. 8C, in order to improve crystallinity of the nanorods 351$a$ and have thermodynamically stable crystal surfaces appropriate for crystal growth, a process of re-growing the nanorods 351$a$ may be performed. Since the same process as that described with reference to FIG. 2F may be used, repeated descriptions will be omitted.

Subsequently, a current spreading layer 354 may be formed on surfaces of nanocores 351 on which a current blocking intermediate layer 352 is formed on upper end portions thereof. Since the same process as that described with reference to FIG. 7B may be used, repeated descriptions will be omitted.

Then, as illustrated in FIG. 8D, an active layer 353 and a second conductivity-type semiconductor layer 355 may be sequentially formed on the current spreading layer 354 covering the nanocores 351. Since the same process as that described with reference to FIG. 2G may be used, repeated descriptions will be omitted.

Figure 9:
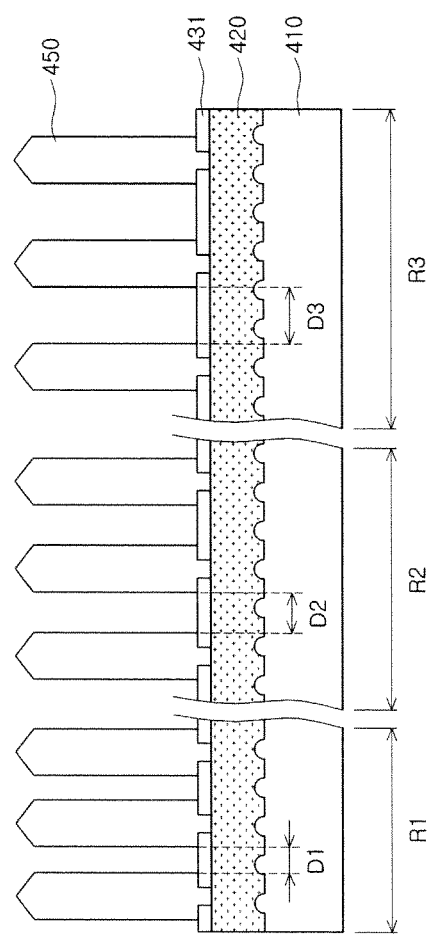
FIG. 9 is a schematic cross-sectional view of a nanoscale light emitting structure according to an exemplary embodiment of the present inventive concept.

FIG. 9 is a schematic cross-sectional view of a nanoscale light emitting structure according to an exemplary embodiment of the present inventive concept.

With reference to FIG. 9, nanoscale light emitting structures 450 according to the embodiment of the present inventive concept may be divided into three regions R1, R2 and R3. In the respective regions, intervals between the nanoscale light emitting structures 450 may be different from one another. For example, the intervals therebetween may be first to third distances D1, D2 and D3 having different distances, respectively. For example, the first distance D1 may be smallest and the third distance D3 may be greatest.

As in the embodiment of the present inventive concept, in the case that the nanoscale light emitting structures 450 are divided into the first to third regions R1 to R3 in which the intervals between the nanoscale light emitting structures 450 are different from one another, contents of indium (In) in active layers of the nanoscale light emitting structures 450 grown in the respective regions or growth thicknesses thereof may be different. For example, in the case of growth under the same growth conditions as each other, as an interval between the nanoscale light emitting structures 450 is increased, the content of indium (In) in the active layer may be increased, and a growth thickness thereof may be increased. Thus, the nanoscale light emitting structures 450 in the first to third regions R1 to R3 may emit light having different wavelengths, and may emit white light as mixed light thereof.

According to an exemplary embodiment of the present inventive concept, the size of the nanoscale light emitting structure 450 may be different according to that in the first to third regions R1 to R3.

Figure 10A:
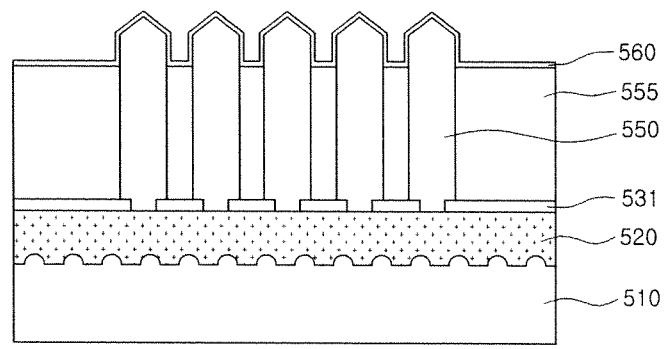
FIGS. 10A and 10B are cross-sectional views illustrating a method of manufacturing an electrode structure used in an exemplary embodiment of the present inventive concept.
Figure 10B:
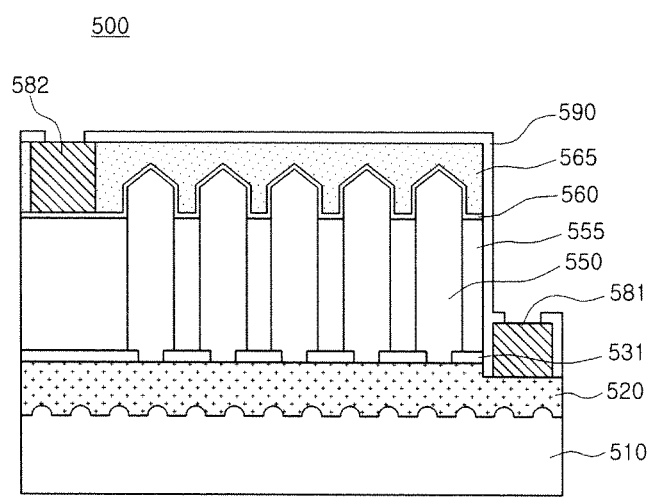

FIGS. 10A and 10B are cross-sectional views illustrating a method of manufacturing an electrode structure used in an exemplary embodiment of the present inventive concept.

First, as illustrated in FIG. 10A, spaces between nanoscale light emitting structures 550 may be partially filled so as to allow upper regions of the nanoscale light emitting structures 550 to be exposed, to thus form a first insulation filling layer 555. Thereafter, a contact electrode 560 may be formed on the exposed upper regions of the nanoscale light emitting structures 550 and the first insulation filling layer 555.

The exposed upper regions of the nanoscale light emitting structures 550 may be provided as contact regions connected to the contact electrode 560. The contact region may be determined by a height of the nanoscale light emitting structures 550 and a thickness of the first insulation filling layer 555.

A distance by which the contact electrode 560 is spaced apart from a first insulating layer 531 may be at least about 50% or more of a height of the nanoscale light emitting structure 550. In a specific example, the distance by which the contact electrode 560 is spaced apart from the first insulating layer 531 may be greater than about 70% of a height of the nanoscale light emitting structure 550.

The first insulation filling layer 555 may be formed using oxide or nitride, and in detail, the first insulation filling layer 555 may be a CVD-SiO2 layer, a tetraethyl orthosilicate (TEOS) layer, a borophospho silicate glass (BPSG) layer, a spin-on-glass (SOG) layer, a spin-on-dielectric (SOD) layer, or the like. In addition, in some cases, the first insulation filling layer 555 may be formed using a thermosetting polymer such as an epoxy resin, a silicon resin, a polyester resin, and the like.

The contact electrode 560 may be formed through a deposition process such as chemical vapor deposition (CVD) or physical vapor deposition (PVD). The contact electrode 560 may be formed using a material capable of implementing ohmic contact with the second conductivity-type semiconductor layer (155 of FIG. 2G, 255 of FIG. 6D, or 355 of FIG. 7D). For example, the contact electrode 560 may contain at least one of silver (Ag), nickel (Ni), aluminium (Al), rhodium (Rh), paladium (Pd) iridium (Ir), ruthenium (Ru), magnesium (Mg), zinc (Zn), platinum (Pt) and gold (Au) and may have a structure of a single layer or a plurality of layers. The contact electrode 560 may be formed using transparent conductive oxide. For example, the contact electrode 560 may be formed using at least one of a group including indium tin oxide (ITO), zinc-doped indium tin oxide (ZITO), zinc indium oxide (ZIO), gallium indium oxide (GI), zinc tin oxide (ZTO), fluorine-doped tin oxide (FTO), aluminium-doped zinc oxide (AZO), gallium-doped zinc oxide (GZO), $In_4Sn_3O_{12}$ and $Zn_{(1-x)}Mg_xO$ ($0 \leq x \leq 1$). The contact electrode 560 may also contain graphene as needed.

On the other hand, in the case of the nanoscale light emitting structure 550 according to the embodiment of the present inventive concept, the nanoscale light emitting structures 250 and 350 as illustrated in FIG. 6D or FIG. 7D may be employed as well as the nanoscale light emitting structure 150 illustrated in FIG. 2G.

Next, as illustrated in FIG. 10B, a second insulation filling layer 565 may be formed on the contact electrode 560.

The second insulation filling layer 565 may fill the remaining spaces between the nanoscale light emitting structures 550 so as to cover the nanoscale light emitting structures 550. The second insulation filling layer 565 may be formed using a material similar to that of the first insulation filling layer 555.

On the other hand, the second insulation filling layer 565 may not be separately provided. For example, by providing the contact electrode 560 as a thick film, spaces between nanoscale light emitting structures may be filled with such a thick film, the contact electrode 560.

Subsequently, a portion of a base layer 520 and a portion of a contact electrode 565 may be exposed through a photolithography and plasma etching process. A first electrode 581 and a second electrode 582 may be formed on the exposed portions of the base layer 520 and the contact electrode 565, respectively.

Examples of materials of the first electrode 581 and the second electrode 582 may include gold (Au), silver (Ag), aluminium (Al), titanium (Ti), tungsten (W), copper (Cu), tin (Sn), nickel (Ni), platinum (Pt), chromium (Cr), aluminium-doped zinc oxide (AZO), gallium-doped zinc oxide (GZO), indium tin oxide (ITO), graphene, TiW, AuSn or eutectic metals thereof.

Next, an additional passivation layer 590 may be formed. The passivation layer 590 may cover and protect the exposed region of the base layer 520, and in addition, may allow the first and second electrodes 581 and 582 to be maintained firmly. In addition, the passivation layer 590 may cover and protect the exposed contact electrode 560 along lateral surfaces of the first and second insulation filling layers 555 and 565.

In the case of such a layout of the contact electrode 560, since a current applied to the nanoscale light emitting structures 550 is supplied through both ends of the nanoscale light emitting structure 550, a relatively uniform distribution of current density may be obtained in an overall region of the nanoscale light emitting structures 550 and may relieve a phenomenon of current concentration into lower end portions of the nanoscale light emitting structures 550.

Figure 11A:
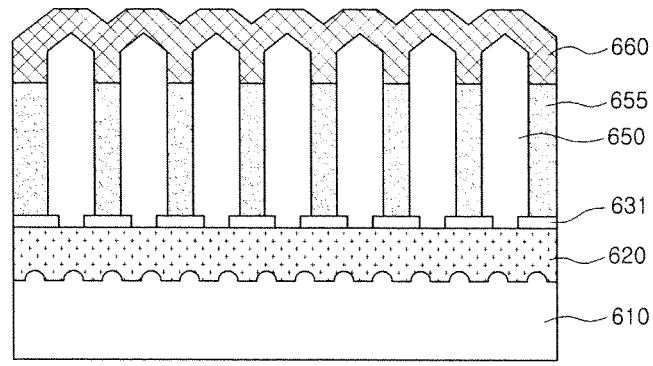
FIGS. 11A and 11B are cross-sectional views illustrating a method of manufacturing an electrode structure used in an exemplary embodiment of the present inventive concept.
Figure 11B:
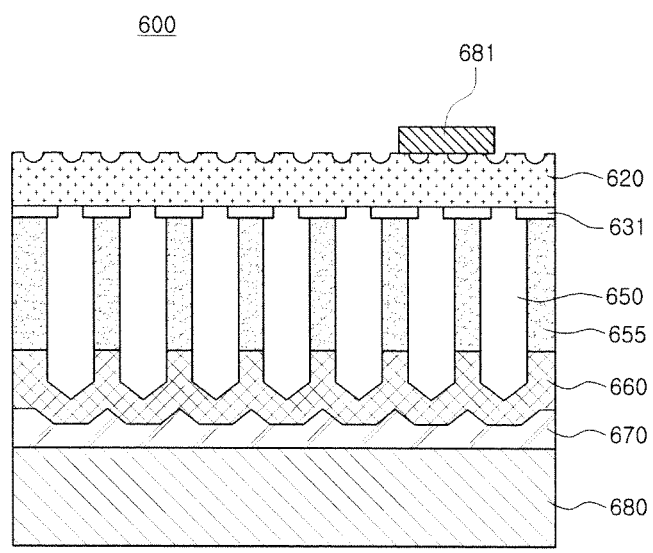

FIGS. 11A and 11B are cross-sectional views illustrating a method of manufacturing an electrode structure used in an exemplary embodiment of the present inventive concept.

With reference to FIGS. 11A and 11B, a method of manufacturing a vertical electrode structure for use in a nanostructure semiconductor light emitting device is illustrated.

First, as illustrated in FIG. 11A, an insulation filling layer 655 may be formed by partially filling spaces between nanoscale light emitting structures 650 to allow upper regions of the nanoscale light emitting structures 650 to be exposed. Then, a contact electrode layer 660 may be formed in the exposed upper regions of the nanoscale light emitting structures and the insulation filling layer 655. The contact electrode layer 660 employed in the embodiment of the present inventive concept may have a relatively large thickness so as to fill the remaining spaces between the nanoscale light emitting structures 650, unlike the case of the embodiment in the present inventive concept described with reference to FIGS. 10A and 10B. The contact electrode layer 660 may be formed using a material as described according to the foregoing embodiment of the present inventive concept, and in detail, may be configured of a reflective metal layer to increase light extraction efficiency.

Subsequently, as illustrated in FIG. 11B, a support substrate 680 may be bonded to the contact electrode layer 660 using a bonding metal layer 670.

The support substrate 680 may be provided as a conductive substrate and may be, for example, a Si substrate or a Si—Al alloy substrate. As a material of the bonding metal layer 670, a metal or an alloy selected from a group consisting of nickel (Ni), platinum (Pt), gold (Au), copper (Cu), cobalt (Co), tin (Sn), indium (In), zinc (Zn), bismuth (Bi), tungsten (W), titanium (Ti) and alloys thereof. For example, the bonding metal layer 670 may be a eutectic metal layer such as a Ni/Sn layer or an Au/Sn layer. In some cases, a Ni/Ti layer, a Ti/W layer, or the like may be additionally used as a diffusion barrier layer to prevent elements forming such a bonding metal layer from being diffused to a semiconductor layer.

Then, a substrate 610 used for crystal growth may be removed from a base layer 620. Such a substrate removal process may be performed through a laser lift-off process, a chemical lift-off process, or a polishing process. For example, when the substrate 610 is a sapphire substrate, a laser beam may be irradiated onto an interface between the substrate 610 and the base layer 620 to thus separate the substrate 610 from the base layer 620. In some cases, in order to reduce a bending degree of the substrate, the laser lift-off process may be performed at a temperature higher than room temperature.

Subsequently, a first electrode 681 may be formed on a surface of the base layer 620 obtained after the substrate 610 is removed, such that a nanostructure semiconductor light emitting device 600 having a vertical electrode structure may be obtained. The support substrate 680 may be provided as a conductive substrate and may be used as a second electrode connected to an external circuit.

Figure 12:
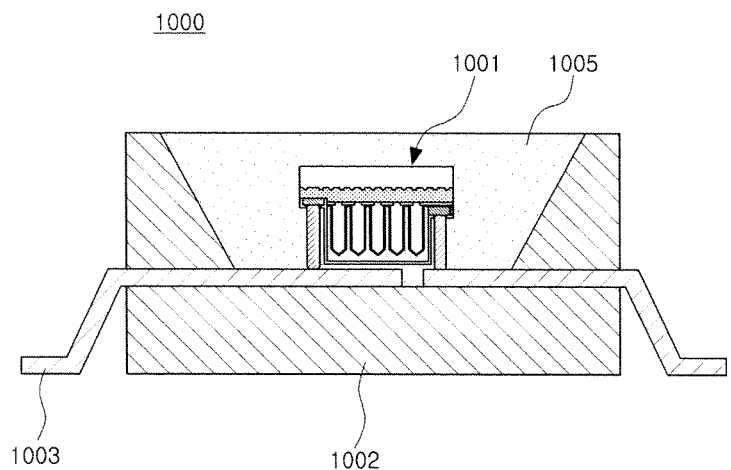
FIGS. 12 and 13 are side cross-sectional views of packages including a nanostructure semiconductor light emitting device according to an exemplary embodiment of the present inventive concept.
Figure 13:
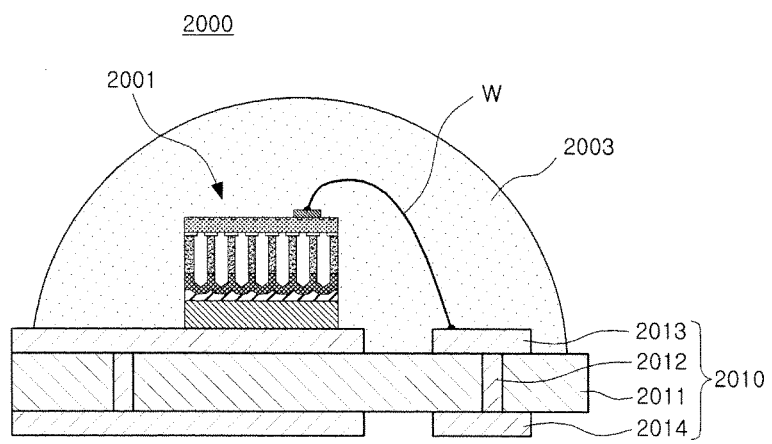

FIGS. 12 and 13 illustrate examples in which a nanostructure semiconductor light emitting device according to an exemplary embodiment of the present inventive concept is applied to a package.

With reference to FIG. 12, a semiconductor light emitting device package 1000 may include a nanostructure semiconductor light emitting device 1001, a package body 1002, and a pair of lead frames 1003. The nanostructure semiconductor light emitting device 1001 may be mounted on the lead frame 1003 such that a pair of electrodes of the nanostructure semiconductor light emitting device 1001 may be electrically connected to the lead frame 1003. According to an exemplary embodiment in the present inventive concept, the nanostructure semiconductor light emitting device 1001 may also be mounted on other regions instead of the lead frame 1003, for example, in the package body 1002. The package body 1002 may have a cut shape to improve light reflection efficiency. Such a reflective cup may be provided with an encapsulant 1005 formed therein, filled with a light transmitting material to encapsulate the nanostructure semiconductor light emitting device 1001 and the like.

In the embodiment of the present inventive concept, the semiconductor light emitting device package 1000 is illustrated as including the nanostructure semiconductor light emitting device 1001 having a structure similar to that of the nanostructure semiconductor light emitting device 100 illustrated in FIG. 1. In detail, the nanostructure semiconductor light emitting device 100 of FIG. 1 may be mounted in a flip-chip structure in which both of the first and second electrodes 181 and 182 are disposed toward the package body 1002. On the other hand, according to an exemplary embodiment of the present inventive concept, the semiconductor light emitting device package 1000 may also include the nanostructure semiconductor light emitting device 100 of FIG. 1 in which the first and second electrodes 181 and 182 are disposed toward upper direction and the first and second electrodes 181 and 182 may be electrically connected to the lead frame 1003 through a wire. According to an exemplary embodiment in the present inventive concept, the semiconductor light emitting device package 1000 may also include a semiconductor light emitting device 500 or 600 according to another embodiment of the present inventive concept with reference to FIG. 10B or 11B.

With reference to FIG. 13, a semiconductor light emitting device package 2000 may include a nanostructure semiconductor light emitting device 2001, a mounting substrate 2010, and an encapsulant 2003. The nanostructure semiconductor light emitting device 2001 may be mounted on the mounting substrate 2010 to be electrically connected to the mounting substrate 2010 through a wire W and a conductive support substrate 680 (see FIG. 11B).

The mounting substrate 2010 may include a substrate body 2011, an upper electrode 2013, and a lower electrode 2014. Further, the mounting electrode 2010 may include a through electrode 2012 connecting the upper electrode 2013 and the lower electrode 2014 to each other. The mounting substrate 2010 may be provided as a substrate such as a printed circuit board (PCB), a metal-core printed circuit board (MCPCB), a metal printed circuit board (MPCB), a flexible printed circuit board (FPCB), or the like, and the structure of the mounting substrate 2010 may be variously applied.

An upper surface of the encapsulant 2003 may have a convex, dorm-shaped lens structure. However, according to an exemplary embodiment of the present inventive concept, the surface of the encapsulant 2003 may be a convex or a concave shaped lens structure, so as to be able to adjust an angle of beam spread in light emitted through the upper surface of the encapsulant 2003. In addition, a wavelength conversion material such as a phosphor, a quantum dot, or the like may be disposed in the encapsulant 2003 or on a surface of the nanostructure semiconductor light emitting device 2001 as needed.

In the embodiment of the present inventive concept, the semiconductor light emitting device package 2000 is illustrated as including the nanostructure semiconductor light emitting device 2001 having the same structure as that of the nanostructure semiconductor light emitting device 600 illustrated in FIG. 11B, but according to an exemplary embodiment of the present inventive concept, may also include a semiconductor light emitting device 100 or 500 according to another embodiment of the present inventive concept with reference to FIG. 1 or 10B.

Figure 14:
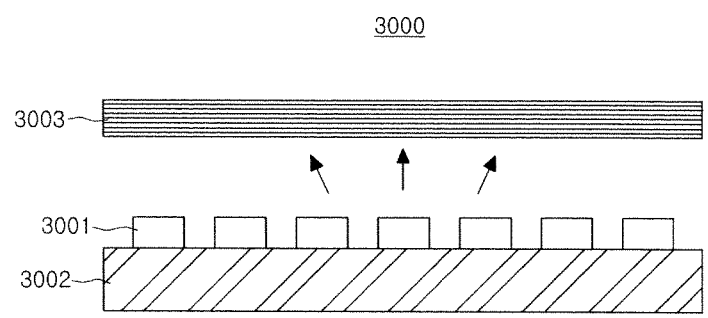
FIGS. 14 and 15 illustrate examples of backlight units in which a nanostructure semiconductor light emitting device according to an exemplary embodiment of the present inventive concept is employed.
Figure 15:
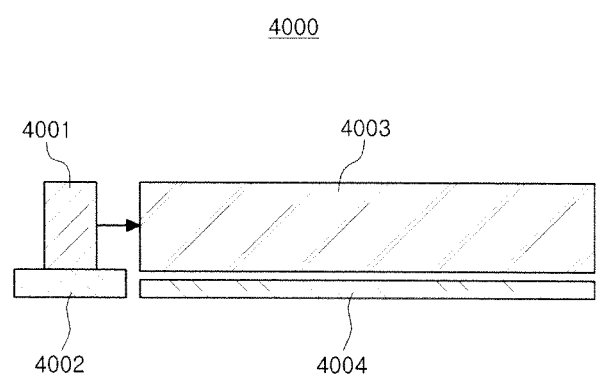

FIGS. 14 and 15 illustrate examples in which nanostructure semiconductor light emitting devices according to embodiments of the present inventive concept are respectively applied to backlight units.

With reference to FIG. 14, a back light unit 3000 may include a light source 3001 mounted on a substrate 3002 and one or more optical sheets 3003 disposed thereon. In the case of the light source 3001, a semiconductor light emitting device package having the afore-described structure with reference to FIGS. 12 and 13 or a structure similar thereto may be used, and in addition, a semiconductor light emitting device may be directly mounted on the substrate 3002 (a so-called chip on board (COB) mounting manner) to be used.

In the back light unit 3000 of FIG. 14, the light source 3001 emits light upwardly in a direction in which a liquid crystal display device is disposed, while in a back light unit 4000 of another example illustrated in FIG. 15, a light source 4001 mounted on a substrate 4002 emits light in a lateral direction such that the emitted light may be incident onto a light guiding panel 4003 to be converted into a form of surface light source type light. Light passed through the light guiding panel 4003 may be discharged in an upward direction, and a reflective layer 4004 may be disposed below the light guiding panel 4003 to improve light extraction efficiency.

Figure 16:
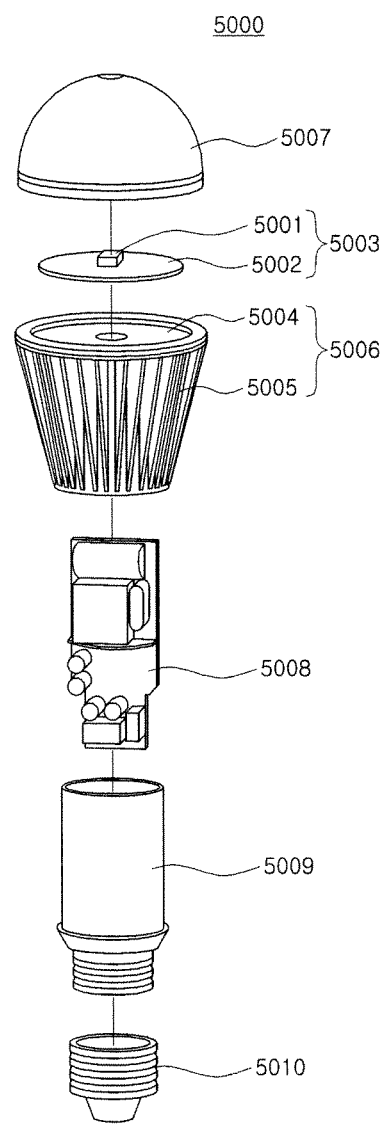
FIG. 16 illustrates an example of a lighting device in which a nanostructure semiconductor light emitting device according to an exemplary embodiment of the present inventive concept is employed.

FIG. 16 illustrates an example in which a nanostructure semiconductor light emitting device according to an exemplary embodiment of the present inventive concept is applied to a lighting device.

With reference to an exploded perspective view of FIG. 16, a lighting device 5000 may be a bulb type lamp by way of example. The lighting device 5000 may include a light emitting module 5003, a driving unit 5008, and an external connection unit 5010. In addition, the lighting device 5000 may further include a structure of appearance such as external and internal housings 5006 and 5009 and a cover unit 5007. The light emitting module 5003 may include a semiconductor light emitting device 5001 having the same structure as or a structure similar to that of the semiconductor light emitting device 100, 500, or 600 of the embodiment described with reference to FIG. 1, 10B or 11B, and a circuit board 5002 on which the semiconductor light emitting device 5001 is mounted. Although the present embodiment describes the case in which a single semiconductor light emitting device 5001 is mounted on the circuit board 5002, a plurality of semiconductor light emitting devices may be mounted on the circuit board as needed. In addition, instead of allowing the semiconductor light emitting device 5001 to be directly mounted on the circuit board 5002, the semiconductor light emitting device 5001 may be manufactured as a package type light emitting device and then mounted.

The external housing 5006 may serve as a heat radiating unit, and may include a heat radiating plate 5004 directly contacting the light emitting module 5003 to improve a heat radiation effect and radiating fins 5005 disposed to encompass a side of the lighting device 5000. The cover unit 5007 may be mounted on the light emitting module 5003 and have a convex lens shape. The driving unit 5008 may be installed in the internal housing 5009 to be connected to the external connection unit 5010 having a structure such as a socket structure so as to receive power from an external power supply. In addition, the driving unit 5008 may convert the received power into a current source suitable for driving the light source 5001 of the light emitting module 5003 to then be supplied. For example, the driving unit 5008 may be configured of an AC to DC converter, a rectifying circuit component, or the like.

In addition, although not illustrated in the drawing, the lighting device 5000 may further include a communications module.

Figure 17:
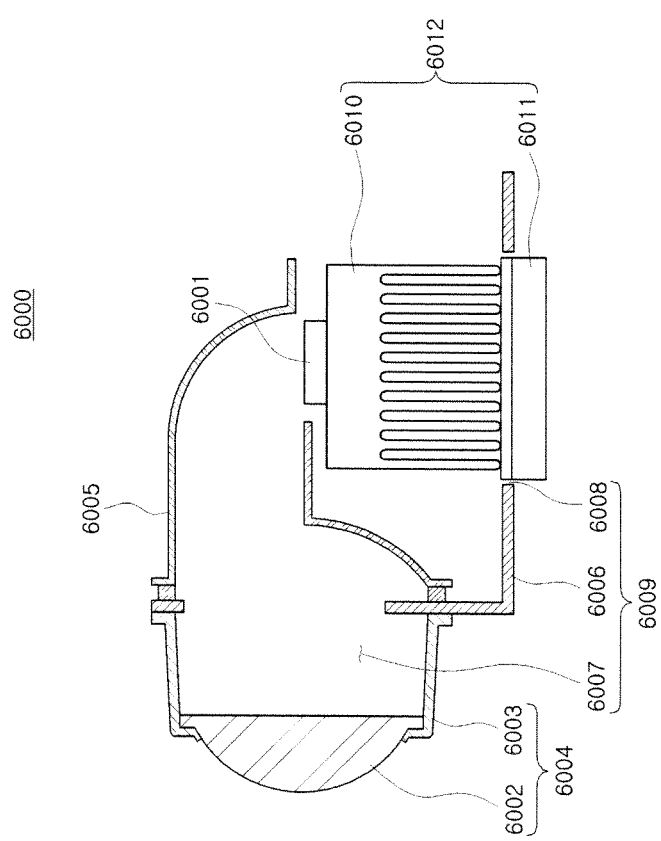
FIG. 17 illustrates an example of a headlamp in which a nanostructure semiconductor light emitting device according to an exemplary embodiment of the present inventive concept is employed.

FIG. 17 illustrates an example in which a nanostructure semiconductor light emitting device according to an exemplary embodiment of the present inventive concept is applied to a vehicle headlamp.

With reference to FIG. 17, a head lamp 6000 for vehicle lighting or the like may include a light source 6001, a reflective unit 6005 and a lens cover unit 6004, and the lens cover unit 6004 may include a hollow guide 6003 and a lens 6002. The light source 6001 may include at least one of the light emitting device packages of FIGS. 12 and 13. Further, the headlamp 6000 may further include a heat dissipation unit 6012 discharging heat generated in the light source 6001 to the outside. The heat dissipation unit 6012 may include a heat sink 6010 and a cooling fan 6011 to perform effective heat emission. In addition, the headlamp 6000 may further a housing 6009 fixing and supporting the heat dissipation unit 6012 and the reflective unit 6005, and the housing 6009 may include a central hole 6008 for allowing the heat dissipation unit 6012 to be coupled to one surface thereof. Further, the housing 6009 may include a front hole 6007 in the other surface integrally connected to the one surface to then be bent in a direction orthogonal thereto. The reflective unit 6005 may be fixed to the housing 6009, whereby light generated in the light source 6001 may be reflected thereby to pass through the front hole 6007 and then be emitted externally.

According to embodiments of the present inventive concept, a three-dimensional nanoscale light emitting structure having a relatively high aspect ratio by adjusting etching profiles of openings in a mask layer used as a mold portion in a growth process of a nanorod may be obtained efficiently and stably. As a result, a light emission area may be increased to improve light emission efficiency.

While embodiments have been shown and described above, it will be apparent to those skilled in the art that modifications and variations could be made without departing from the scope of the present inventive concept as defined by the appended claims.

What is claimed is:

1. A method of manufacturing a nanostructure semiconductor light emitting device, the method comprising:
preparing a mask layer by sequentially forming a first insulating layer and a second insulating layer on a base layer configured of a first conductivity-type semiconductor;
forming a plurality of openings penetrating through the mask layer in a thickness direction of the mask layer;
growing a plurality of nanorods configured of the first conductivity-type semiconductor in the plurality of openings formed in the mask layer;
exposing the plurality of nanorods by removing the second insulating layer;
forming a plurality of nanocores by re-growing the plurality of nanorods; and
forming a plurality of nanoscale light emitting structures by sequentially growing an active layer and a second conductivity-type semiconductor layer on surfaces of the plurality of nanocores,
wherein the plurality of openings respectively include a mold region located in the second insulating layer and defining a shape of side surfaces of the plurality of nanorods,
wherein the mold region includes at least one curved portion of which an inclination of a side surface varies according to proximity to the first insulating layer, and
wherein the mold region comprises one second-type curved portion in which an inclination of a side surface is altered so that a width of the opening is first increased and then decreased according to proximity to the first insulating layer, and an inclination portion contacting the first insulating layer and having an inclined side surface so that a width of the opening is decreased according to proximity to the first insulating layer.

2. The method of claim 1, wherein the width of the opening in a position of the second-type curved portion is greater than that of an upper end portion of the opening, and a width of a lower end portion of the opening, which contacts the first insulating layer, is 70% or more of the width of the upper end portion of the opening.

3. The method of claim 1, wherein an angle formed by the side surface of the inclination portion and an upper surface of the first insulating layer is greater than 80 degrees and less than 90 degrees.

4. A method of manufacturing a nanostructure semiconductor light emitting device, the method comprising:
preparing a mask layer by sequentially forming a first insulating layer and a second insulating layer on a base layer configured of a first conductivity-type semiconductor;
forming a plurality of openings penetrating through the mask layer in a thickness direction of the mask layer;
growing a plurality of nanorods configured of the first conductivity-type semiconductor in the plurality of openings formed in the mask layer;
exposing the plurality of nanorods by removing the second insulating layer;
forming a plurality of nanocores by re-growing the plurality of nanorods; and
forming a plurality of nanoscale light emitting structures by sequentially growing an active layer and a second conductivity-type semiconductor layer on surfaces of the plurality of nanocores,
wherein the plurality of openings respectively include a mold region located in the second insulating layer and defining a shape of side surfaces of the plurality of nanorods,
wherein the mold region includes at least one curved portion of which an inclination of a side surface varies according to proximity to the first insulating layer, and
wherein the mold region comprises at least one first-type curved portion in which an inclination of a side surface is altered so that a width of the opening is first decreased and then increased according to proximity to the first insulating layer, and at least one second-type curved portion in which an inclination of a side surface is altered so that a width of the opening is first increased and then decreased according to proximity to the first insulating layer.

5. The method of claim 4, wherein the mold region comprises an inclination portion which contacts the first insulating layer and in which a width of the opening is increased according to proximity to the first insulating layer.

6. The method of claim 4, wherein the mold region comprises an inclination portion which contacts the first insulating layer and in which a width of the opening is decreased according to proximity to the first insulating layer.

7. A method of manufacturing a nanostructure semiconductor light emitting device, the method comprising:

Preparing a mask layer by sequentially forming a first insulating layer and a second insulating layer on a base layer configured of a first conductivity-type semiconductor;

forming a plurality of openings penetrating through the mask layer in a thickness direction of the mask layer;

growing a plurality of nanorods configured of the first conductivity-type semiconductor in the plurality of openings formed in the mask layer;

exposing the plurality of nanorods by removing the second insulating layer;

forming a plurality of nanocores by re-growing the plurality of nanorods; and forming a plurality of nanoscale light emitting structures by sequentially growing an active layer and a second conductivity-type semiconductor layer on surfaces of the plurality of nanocores, wherein the plurality of openings respectively include a mold region located in the second insulating layer and defining a shape of side surfaces of the plurality of nanorods, wherein the mold region includes at least one curved portion of which an inclination of a side surface varies according to proximity to the first insulating layer, wherein the plurality of nanoscale light emitting structures comprise a first group of nanoscale light emitting structures formed in a first region of the base layer and a second group of nanoscale light emitting structures formed on a second region of the base layer, and an interval between the nanoscale light emitting structures of the first group and an interval between the nanoscale light emitting structures of the second group are different from each other, and wherein a content of indium formed in the active layer of the nanoscale light emitting structures of the first group and a content of indium formed in the active layer of the nanoscale light emitting structures of the second group are different from each other.

* * * * *